United States Patent
Wang et al.

(10) Patent No.: US 11,805,703 B2
(45) Date of Patent: Oct. 31, 2023

(54) MAGNETIC TUNNEL JUNCTIONS WITH VOLTAGE TUNABLE INTERLAYER COUPLING FOR MEMORY AND SENSOR APPLICATIONS

(71) Applicant: Arizona Board of Regents on Behalf of the University of Arizona, Tucson, AZ (US)

(72) Inventors: Weigang Wang, Tucson, AZ (US); Ty Newhouse-Illige, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 15/720,399

(22) Filed: Sep. 29, 2017

(65) Prior Publication Data

US 2018/0090674 A1 Mar. 29, 2018

Related U.S. Application Data

(60) Provisional application No. 62/401,314, filed on Sep. 29, 2016.

(51) Int. Cl.
*H10N 50/10* (2023.01)
*G11C 11/16* (2006.01)
(Continued)

(52) U.S. Cl.
CPC .......... *H10N 50/10* (2023.02); *G11C 11/1675* (2013.01); *H10N 50/80* (2023.02); *H10N 50/85* (2023.02)

(58) Field of Classification Search
CPC .......... H01L 43/00–12; G11C 11/1675; H10N 50/10
See application file for complete search history.

(56) References Cited

U.S. PATENT DOCUMENTS 8,891,292 B2 * 11/2014 Wang .................... G11C 11/161
  365/158
9,099,641 B2 * 8/2015 Khalili Amiri ......... H01L 43/08
(Continued)

OTHER PUBLICATIONS

P. LeClair et al., "Ferromagnetic-ferromagnetic tunneling and the spin filter effect", published Jun. 4, 1998, J. of Appl. Physics, 76, 6546-6548.*

(Continued)

*Primary Examiner* — Suberr L Chi
(74) *Attorney, Agent, or Firm* — Thomas | Horstemeyer, LLP

(57) ABSTRACT

Various examples are provided for magnetic tunnel junctions and applications thereof. In one example, a magnetic tunnel junction (MTJ) device includes a first ferromagnetic (FM) layer; a gadolinium oxide ($GdO_X$) tunnel barrier disposed on the first ferromagnetic layer; and a second FM layer disposed on the $GdO_X$ tunnel barrier. In another example, a perpendicular MTJ (pMTJ) device includes a first layer including a magnetic material; a tunnel barrier disposed on the first layer to form the pMTJ; and a second layer including the magnetic material, the second layer disposed on the tunnel barrier.

11 Claims, 16 Drawing Sheets

(51) Int. Cl.
*H10N 50/80* (2023.01)
*H10N 50/85* (2023.01)

(56) References Cited

U.S. PATENT DOCUMENTS

| | | | | |
|---|---|---|---|---|
| 9,666,790 | B2* | 5/2017 | Chuang | H01L 27/228 |
| 9,799,825 | B2* | 10/2017 | Bauer | H01L 45/085 |
| 9,818,935 | B2* | 11/2017 | Chuang | H01L 43/12 |
| 2012/0120719 | A1* | 5/2012 | Worledge | G11C 11/1675 365/158 |
| 2014/0124882 | A1* | 5/2014 | Khalili Amiri | H01L 43/08 257/421 |
| 2014/0169083 | A1* | 6/2014 | Wang | G11C 11/161 365/158 |
| 2014/0340961 | A1* | 11/2014 | Ohno | G11C 11/161 365/158 |
| 2015/0325278 | A1* | 11/2015 | Bauer | H01L 43/08 365/158 |
| 2016/0380183 | A1* | 12/2016 | Chuang | H01L 43/12 257/421 |
| 2017/0018704 | A1* | 1/2017 | Chuang | H01L 27/228 |
| 2017/0084824 | A1* | 3/2017 | Bauer | H01L 45/085 |

OTHER PUBLICATIONS

T. Newhouse-Illige et al., "Voltage-controlled interlayer coupling in perpendicularly magnetized magnetic tunnel junctions", May 16, 2017, Nature Communications, vol. 8, pp. 15232-15238.*

"Electric-field tunable magnetic-field-sensor based on CoFeB/MgO magnetic tunnel junction" by Naik et al., Appl. Phys. Lett. 104, 232401 (2014).

"Magnetization switching in a CoFeB/MgO magnetic tunnel junction by combining spin-transfer torque and electric field-effect" by Kanai et al., Appl. Phys. Lett. 104, 212406 (2014).

"Electric-field-induced magnetization switching in CoFeB/MgO magnetic tunnel junctions with high junction resistance" by Kanai et al., Appl. Phys. Lett. 108, 192406 (2016).

"Prediction of switching/rotation of the magnetization direction with applied voltage in a controllable interlayer exchange coupled system" by You et al., J. Magn. Magn. Mater. 195, 488-500 (1999).

"Deterministic switching of ferromagnetism at room temperature using an electric field" by Heron et al., Nature 516, 370-3 (2014).

"Electric-field-assisted switching in magnetic tunnel junctions" by Wang et al. Nat. Mater. 11, 64 (2012).

"Ultra-low switching energy and scaling in electric-field-controlled nanoscale magnetic tunnel junctions with high resistance-area product" by Grezes et al. Appl. Phys. Lett. 20, 2-5 (2016).

* cited by examiner

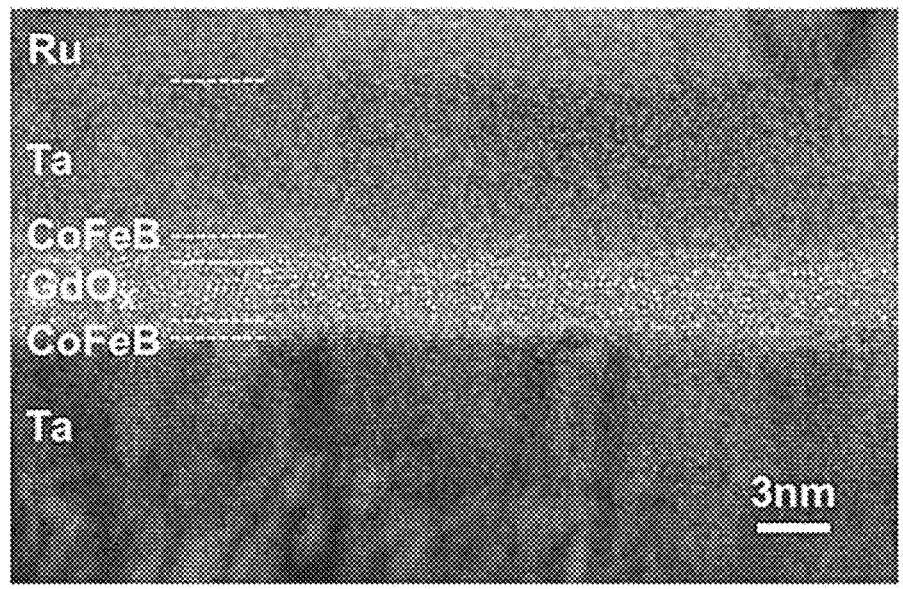
FIG. 2A
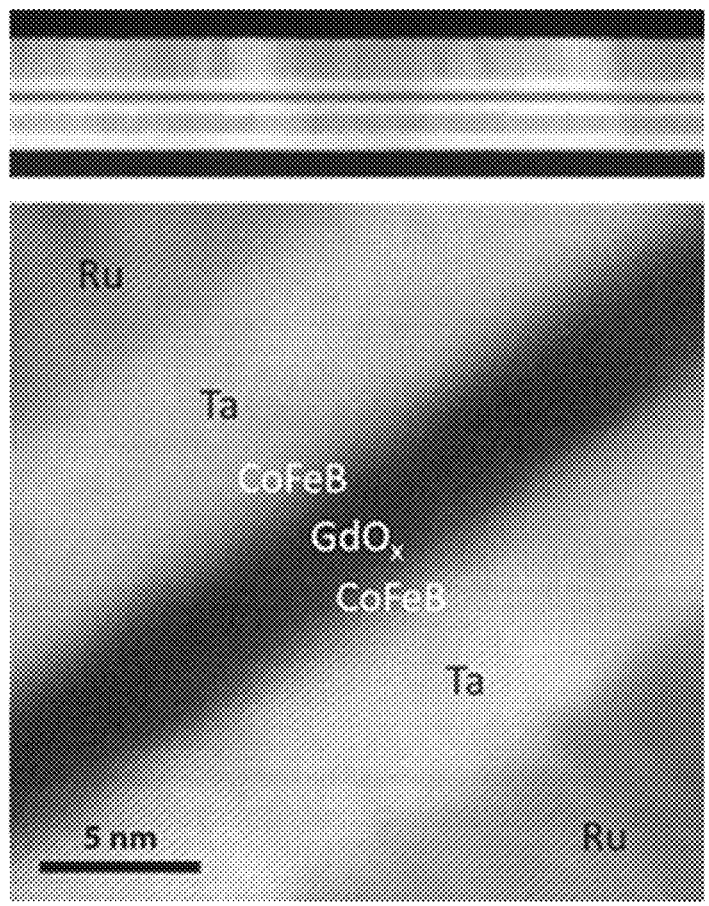
FIG. 2B
FIG. 2C

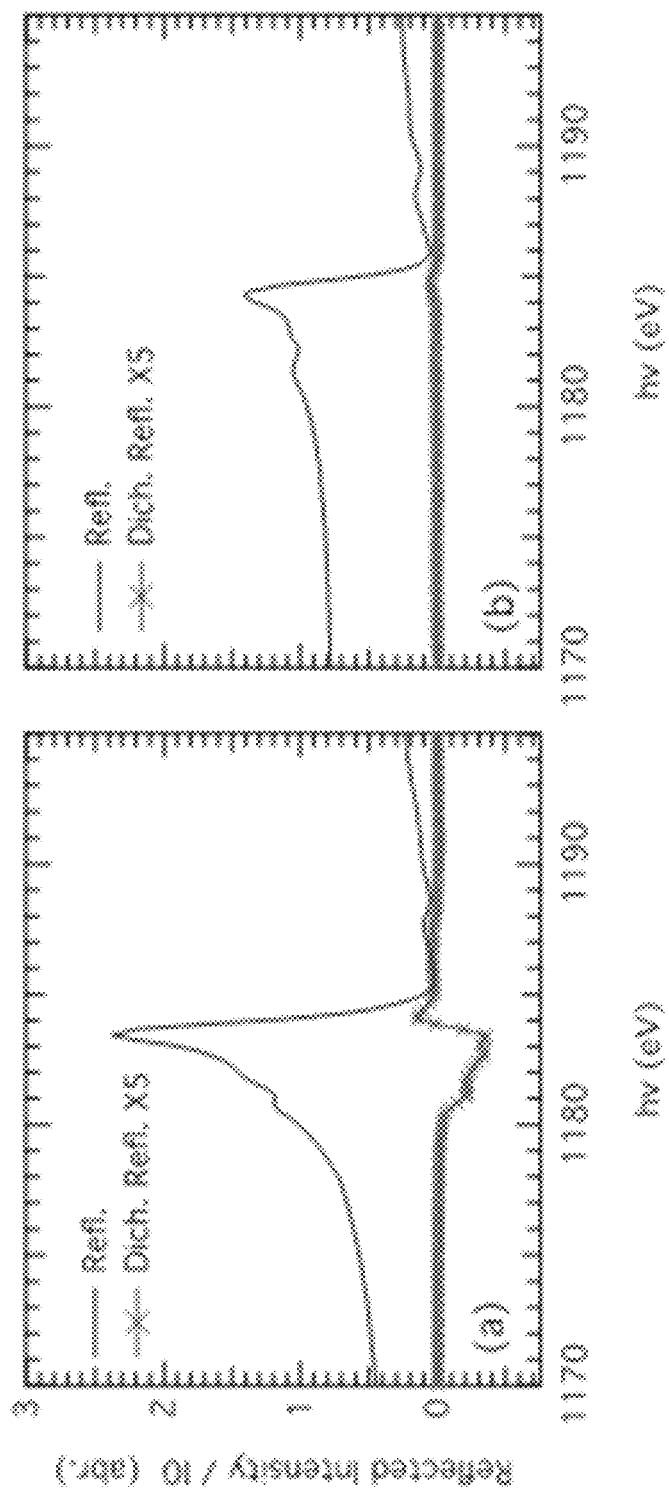

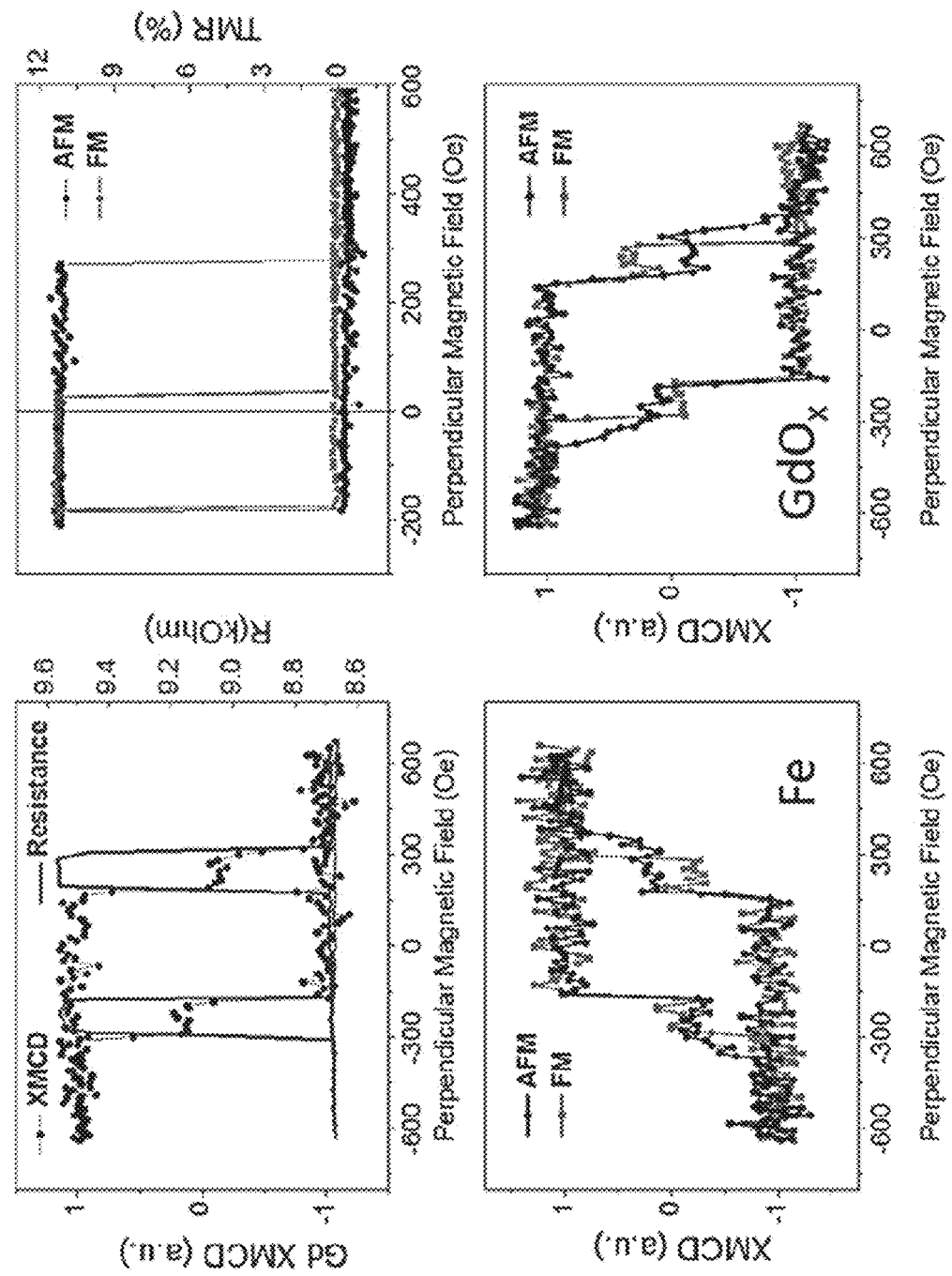

MAGNETIC TUNNEL JUNCTIONS WITH VOLTAGE TUNABLE INTERLAYER COUPLING FOR MEMORY AND SENSOR APPLICATIONS

CROSS REFERENCE TO RELATED APPLICATIONS

This application claims priority to, and the benefit of, co-pending U.S. provisional application entitled "Magnetic Tunnel Junctions with Voltage Tunable Interlayer Coupling for Memory and Sensor Applications" having Ser. No. 62/401,314, filed Sep. 29, 2016, which is hereby incorporated by reference in its entirety.

STATEMENT REGARDING FEDERALLY SPONSORED RESEARCH OR DEVELOPMENT

This invention was made with government support under Grant Nos. ECCS1310338 and 1053854, awarded by NSF; Grant No. DE-AC02-06CH11357 awarded by DOE; and Grant No. HR0011-13-3-0002, awarded by DARPA. The government has certain rights in the invention.

BACKGROUND

In spintronics, information can be stored with the spin orientations of nanomagnets. A nanomagnet can be switched by a magnetic field governed by Ampere's Law, or by current-induced spin transfer torques (STT) and spin-orbit torques (SOT). Lowering the switching energy of the nanomagnets in magnetic tunnel junctions can improve operation of the devices by reducing heating.

SUMMARY

Embodiments of the present disclosure are related to magnetic tunnel junctions and applications thereof. In one embodiment, among others, a magnetic tunnel junction (MTJ) device, comprises a first ferromagnetic (FM) layer; a gadolinium oxide ($GdO_X$) tunnel barrier disposed on the first ferromagnetic layer; and a second FM layer disposed on the $GdO_X$ tunnel barrier. In one or more aspects of these embodiments, the $GdO_X$ tunnel barrier between the first and second FM layers can form a perpendicular MTJ (pMTJ). The first FM layer can be a fixed FM layer and the second FM layer is a free FM layer. A low resistance state can be established by application of a positive voltage pulse across the free and fixed layers under zero magnetic field, or a high resistance state can be established by application of a negative voltage pulse across the free and fixed layers under zero magnetic field. A negative pulse can establish antiferromagnetic (AFM) coupling between the free and fixed layers and a positive pulse can establish FM coupling between the layers.

In one or more aspects of these embodiments, a thickness of the $GdO_X$ tunnel barrier can be in a range from about 1 nm to about 3.5 nm. The first and second FM layers can comprise cobalt iron boron (CoFeB). A thickness of the first FM layer can be in a range from about 0.7 nm to about 0.9 nm and a thickness of the second FM layer can be in a range from about 1.5 nm to about 1.6 nm. The resistance state of the MTJ device can be controllable at room temperature. In various aspects, a sensor comprising the MTJ can detect a magnetic field. A memory storage system can comprise the MTJ device.

In other embodiments, a perpendicular magnetic tunnel junction (pMTJ) device comprises a first layer comprising a magnetic material; a tunnel barrier disposed on the first layer to form the perpendicular MTJ; and a second layer comprising the magnetic material, the second layer disposed on the tunnel barrier. In one or more aspects of these embodiments, the tunnel barrier can comprise gadolinium oxide ($GdO_X$), magnesium oxide (MgO), zirconium oxide (ZrO), hafnium oxide (HfO), lanthanum oxide $La_2O_3$, aluminum oxide $AlO_x$, copper (Cu), ruthenium (Ru) or silver (Ag). The magnetic material can comprise cobalt-iron-boron (CoFeB), iron (Fe), nickel-iron (NiFe), cobalt-iron (CoFe), cobalt (Co) or nickel (Ni). The first layer can be a fixed ferromagnetic (FM) layer and the second layer can be a free FM layer. A low resistance state can be established by application of a positive voltage pulse across the free and fixed layers under zero magnetic field, or a high resistance state can be established by application of a negative voltage pulse across the free and fixed layers under zero magnetic field. One pulse polarity can establish antiferromagnetic (AFM) coupling between the free and fixed layers and the other pulse polarity can establish FM coupling between the layers. In various aspects, the resistance state of the pMTJ device can be controllable at room temperature. In various aspects, a sensor comprising the pMTJ can detect a magnetic field. A memory storage system can comprise the pMTJ device.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 2A-2C are images illustrating an example of a rare earth oxide magnetic tunnel junction (MTJ), in accordance with various embodiments of the present disclosure.

FIGS. 8D and 8E illustrate examples of measured dichroic reflectivity in a pMTJ at the M edge of Gd with and without CoFeB adjacent, in accordance with various embodiments of the present disclosure.

FIGS. 10A-10D illustrate examples of simultaneous measurements of TMR and XMCD in a $GdO_x$-pMTJ, in accordance with various embodiments of the present disclosure.

DETAILED DESCRIPTION

Figures 1A, 1B:
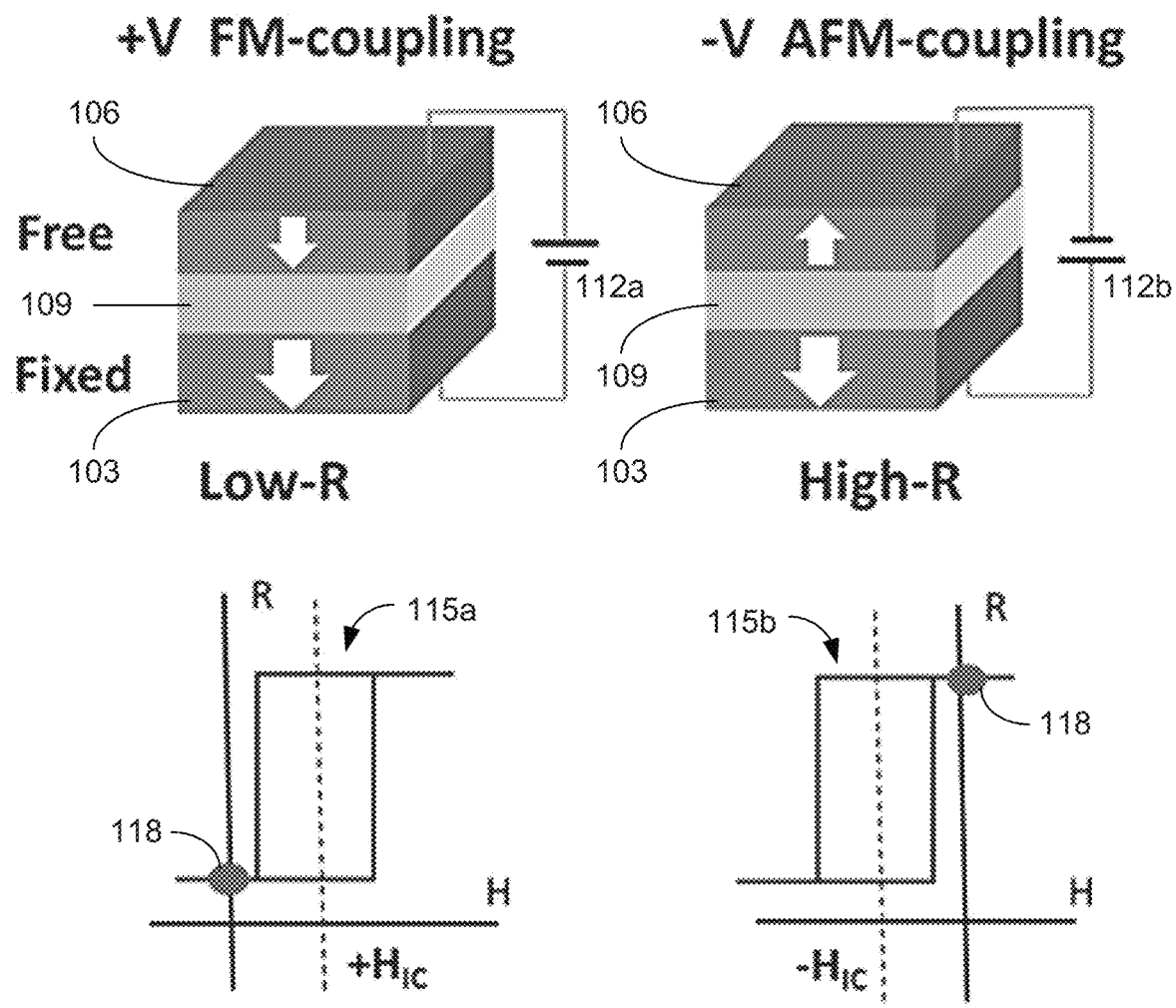
FIGS. 1A and 1B illustrate an example of switching of an MTJ 100 by voltage controlled interlayer coupling (VCIC), in accordance with various embodiments of the present disclosure.

Disclosed herein are various embodiments related to magnetic tunnel junctions and applications thereof. Presented is an example demonstrating voltage controlled interlayer coupling in a magnetic tunnel junction (MTJ) system with a gadolinium oxide ($GdO_x$) tunnel barrier, where a large perpendicular magnetic anisotropy and a sizable tunneling magnetoresistance has been achieved at room temperature. Both the magnitude and sign of the interlayer coupling can be directly controlled by voltage.

Magnetic interlayer coupling, the parallel or antiparallel alignment of ferromagnetic layers in proximity to each other in the absence of external magnetic fields, is one of the central phenomena in spintronics. It has been predicted that the sign of interlayer coupling can be manipulated by electric fields, instead of electric currents, thereby offering a promising way to achieve low energy magnetization switching. It is highly desirable to accomplish magnetization switching with voltage to reduce or eliminate Joule heating, which can dramatically reduce the switching energy. Voltage switchable perpendicular magnetic tunnel junctions (pMTJs) can exhibit a switching energy that is ten times smaller than that of spin transfer torques (STT). With voltage controlled magnetic anisotropy (VCMA), the duration of the voltage pulses and the size distribution of the nanomagnets need to be precisely controlled. Another way to achieve voltage induced switching in pMTJs is by controlling the interlayer coupling of hard (fixed) and soft (free) ferromagnetic (FM) layers on opposite sides of the tunnel barrier.

Here, a demonstration of voltage controlled interlayer coupling in a new pMTJ system with $GdO_X$ tunnel barriers, where a large perpendicular magnetic anisotropy and a sizable tunneling magnetoresistance have been achieved at room temperature, is presented. Due to the interfacial nature of the magnetism, the ability to move oxygen vacancies within the barrier, and a large proximity-induced magnetization of $GdO_X$, both the magnitude and the sign of the interlayer coupling in these junctions can be directly controlled by voltage. These results show that energy efficient magnetization switching can be achieved by controlling interlayer coupling.

Increasingly spintronics, storing data with spin orientations of nanomagnets instead of charge, can be used for new computing devices. Taking advantage of the electron's spin degree of freedom in addition to its charge allows for non-volatile, low power, memory, logic, and magnetic sensor devices. MTJs can be switched with a magnetic field, a spin-polarized current by spin transfer torques (STT), or a pure spin current by spin-orbit torques (SOT). The state of an MTJ can be changed with voltage for low-power operation and easy integration with CMOS technologies. In MTJs with perpendicular magnetic anisotropy (pMTJ), the resistance can be switched through a combination of voltage controlled magnetic anisotropy (VCMA) and STT. Additionally, pMTJs can be switched precessionally in a sub-nanosecond time scale by the effective in-plane field generated by the VCMA effect. In addition to VCMA, voltage induced switching in pMTJs can be achieved at room temperature (RT) by controlling the interlayer coupling of the hard and soft ferromagnetic (FM) layers.

Voltage controlled interlayer coupling (VCIC) offers another path for voltage switching of MTJs. This technique can be used in a pMTJ system with a $GdO_X$ barrier, where the interlayer coupling field ($H_{IC}$) can be reversibly and deterministically controlled by voltage. Interlayer exchange coupling is one of the most central phenomena in spintronics. The observation of antiferromagnetically (AFM) coupled FM layers through nonmagnetic (NM) spacers and the subsequent discovery of giant magnetoresistance (GMR) led to the birth of spintronics. By controlling the reflection coefficients of spin-up and spin-down electrons at the interfaces or by modifying the induced charge and magnetization in FM/NM/FM multilayers, the interlayer coupling and thus the magnetoresistance can be changed with applied voltage.

Referring to FIGS. 1A and 1B, an example of switching of an MTJ 100 by VCIC is schematically illustrated. The core structure of an MTJ 100 comprises a fixed FM layer 103 and a free FM layer 106 separated by a tunnel barrier 109. As shown in FIG. 1A, the MTJ 100 can be set to a low resistance state with FM coupling by applying a positive voltage pulse 112a under zero magnetic field. The FM coupled state can be revealed by the positive shift of the minor RT tunneling magnetoresistance (TMR) loop 115a, measured with the bottom FM layer 103 kept pointing down (fixed) while changing the spin orientation of the top FM layer 106 by sweeping an external magnetic field. As shown in FIG. 1B, the MTJ 100 can be set to a high resistance state with AFM coupling by applying a negative voltage pulse 112b under zero magnetic field. The AFM coupled state can be revealed by the negative shift of the minor TMR loop 115b, measured with the bottom FM layer 103 kept pointing down (fixed) while changing the spin orientation of the top FM layer 106 by sweeping an external magnetic field. The two resistance values at zero magnetic field are marked by dots 118, which correspond to the two states of the MTJ 100.

Here, an experimental demonstration of VCIC in an MTJ structure is provided. This unprecedented control of interlayer coupling is realized in a new pMTJ system with a rare earth oxide ($GdO_X$) tunnel barrier. A sizable RT tunneling magnetoresistance (TMR) as well as a large perpendicular magnetic anisotropy (PMA) were simultaneously obtained in these pMTJs. Due to the interfacial nature of the PMA, the magnetic properties of the pMTJs can be manipulated by voltage, similarly to CoFeB/MgO/CoFeB junctions. Due to the ability to move oxygen vacancies within the $GdO_X$ tunnel barrier and a surprisingly large induced magnetic moment of the Gd ions, the interlayer coupling in the pMTJs can be reversibly and deterministically switched between AFM and FM states by applied voltage.

Sample fabrication and structural characterization. The structure of the fabricated pMTJs was $Si/SiO_2/Ta$ (8 nm)/Ru (10 nm)/Ta (7 nm)/$Co_{20}Fe_{60}B_{20}$ (0.7-0.9 nm)/$GdO_X$ (1-3.5 nm)/$Co_{20}Fe_{60}B_{20}$ (1.5-1.6 nm)/Ta (7 nm)/Ru (20 nm). The films were deposited in a 12-source UHV magnetron sputtering system (AJA international) with a base pressure of $10^{-9}$ Torr. The CoFeB/$GdO_X$/CoFeB MTJs were deposited on thermally oxidized silicon substrates by the magnetron sputtering system with a base pressure in the range of $10^{-9}$ Torr. After deposition of the multilayers, MTJs in circular shapes with diameters (D) ranging from 3 μm to 20 μm were fabricated and measured in a four-wire geometry. A positive applied voltage corresponds to electrons tunneling from the bottom (fixed) FM layer 103 to the top (free) FM layer 106.

While an example of VCIC in an MTJ structure comprising a gadolinium oxide ($GdO_X$) tunnel barrier disposed between FM layers is presented, other MTJ structures can also be utilized. In other embodiments, the tunnel barrier of the MTJ structure can comprise, but is not limited to, magnesium oxide (MgO), zirconium oxide (ZrO), hafnium oxide (HfO), lanthanum oxide $La_2O_3$, aluminum oxide $AlO_x$, copper (Cu), ruthenium (Ru) or silver (Ag). The FM layers disposed about the tunnel barrier can comprise, but are not limited to, cobalt-iron-boron (CoFeB), iron (Fe), nickel-iron (NiFe) or cobalt-iron (CoFe); or can be layers comprising cobalt (Co) or nickel (Ni). In the presented embodiment, the FM layers are buffered and caped by tantalum (Ta). The buffering and capping layers can comprise but are not limited to, tantalum (Ta), Ruthenium (Ru), tungsten (W), or Molybdenum (Mo). In the presented embodiment, the bottom FM layer is the hard or fixed layer and the top FM layer is the soft or free layer. The order of the fixed and free layer may be reversed or one of both of the layers may be made of a composite of multiple FM layers to achieve the desired magnetic properties of each.

The thickness of the layers was calibrated by X-ray reflectivity with an uncertainty of 10%. All metallic layers were deposited by DC sputtering under Ar pressures of 2-2.5 mTorr. The $GdO_X$ barrier was deposited by $Ar/O_2$ reactive sputtering from a metallic Gd target with an $O_2$ partial pressure of 0.19 mTorr. Samples were then patterned using standard photolithography and ion beam etching. The final pMTJ pillars had a circular shape with a diameter between 3 μm and 20 μm. The fully patterned pMTJs were then annealed for 1-10 minutes at 250-300° C. in a rapid thermal annealing system. All tunneling magnetoresistance in this study was measured at room temperature (RT) unless otherwise specified.

The microstructure of the MTJ was imaged using two transmission electron microscopes (TEMs): an FEI Tecnai G2 F30 at 300 kV for high-resolution conventional transmission electron microscopy (HR-TEM) and an aberration-corrected (CEOS DOOR probe corrector) FEI Titan G2 60-300 STEM equipped with a Schottky X-FEG gun at 200 kV for high-angle annular dark-field scanning transmission electron microscopy (STEM). The structural integrity of the MTJ layers after thermal annealing was confirmed by elemental mapping by energy-dispersive X-ray spectroscopy (EDX) using a Super-X quad-SDD windowless in-polepiece EDX detector in the Titan. The probe convergence angle used for STEM imaging and EDX mapping was 21 mrad. Cross-sectional samples were prepared for TEM analysis by milling with a $Ga^+$ focused ion beam (FIB) at 30 and 10 kV in an FEI Quanta 200 3D dual-beam FIB/SEM.

FIG. 2A shows a high resolution cross-sectional TEM image of an example of the microstructure of the $GdO_X$-pMTJs. Both the $GdO_X$ barrier and the CoFeB electrodes are amorphous in the imaged sample. Smooth interfaces between the FM electrodes 103 and 106 and the tunnel barrier 109 can be seen. The oxide layer shows no crystalline texture, indicating that the barrier is amorphous. X-ray diffraction on thick gadolinium oxide layers shows that it forms the cubic $Gd_2O_3$ phase. It is difficult to determine, however, the exact oxidation state of the Gd in the amorphous barrier. Thus the tunnel barrier 109 is referred to as $GdO_X$.

FIGS. 2B and 2C show high-angle annular dark-field scanning TEM (HAADF-STEM) images of the CoFeB/$GdO_X$/CoFeB pMTJ. The high uniformity of the multilayer structure over a large scale region is visible in FIG. 2B. The core structure of the pMTJ is shown in FIG. 2C with larger magnification. The Ru buffer and capping layer exhibit clear layer-by-layer crystalline structure. The bottom Ta layer shows a mixed crystalline and amorphous structure. No clear crystalline grains can be observed in the top Ta layer. Under the present annealing conditions, the amorphous CoFeB is not likely to be crystallized, based on a previous study of MgO-pMTJs. The contrast in HAADF-STEM images is related to atomic number. The amorphous nature of CoFeB and Ta and the intermediate atomic numbers of CoFeB compared to Ta and $GdO_X$ make it hard to clearly distinguish the interface boundaries in the HAADF images. Nevertheless, it can be seen that no crystalline structure exists in the $GdO_X$ barrier, agreeing with the high-resolution conventional transmission electron microscopy image shown in FIG. 2A.

Figure 3A:
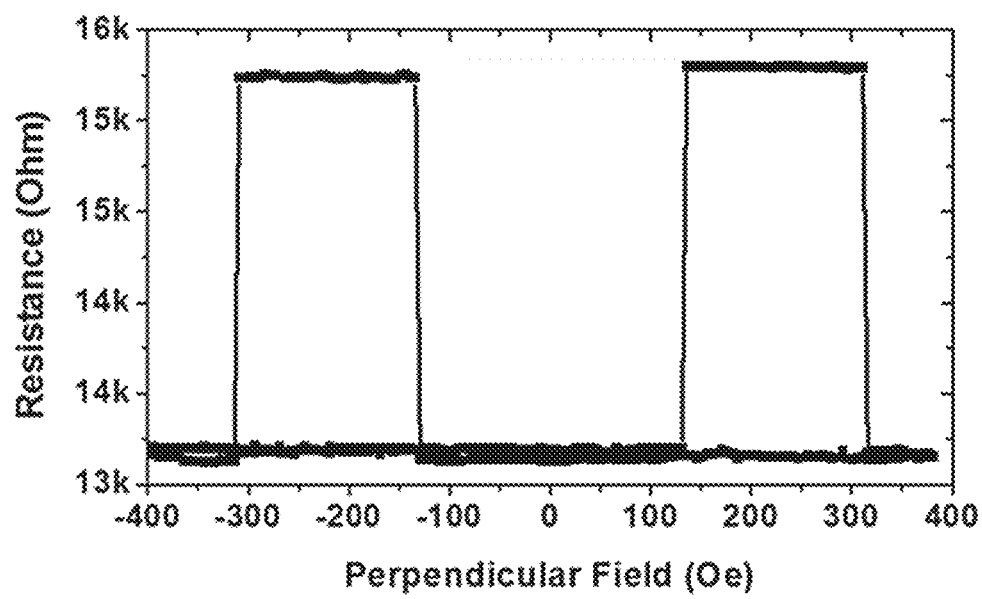
FIGS. 3A-3D illustrate examples of room temperature (RT) tunneling magnetoresistance (TMR) curves and hysteresis loops of a gadolinium oxide perpendicular MTJ ($GdO_x$-pMTJ), in accordance with various embodiments of the present disclosure.
Figure 3B:
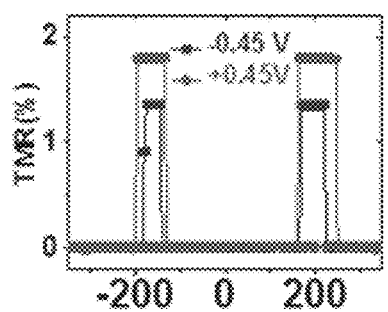

An example of a TMR curve from these $GdO_X$-pMTJs is shown in FIGS. 3A and 3B. FIG. 3A shows a representative RT magnetoresistance curve of a $GdO_X$-pMTJ showing a TMR of 15%, and FIG. 3B shows the VCMA effect where the TMR curves were measured under the application of ±0.45V. The core structure of this MTJ is CoFeB (0.85 nm)/$GdO_X$ (2.1 nm)/CoFeB (1.6 nm) with D=7 μm. FIG. 3A shows very sharp resistance switching and a flat antiparallel state, characteristic of MTJs with perpendicular easy axes. A sizable RT TMR of 15% was observed in this pMTJ, where TMR=(RAP−RP)/RP, with RAP and RP being the resistance in the antiparallel and parallel configurations, respectively. Previously, magnetoresistance in MTJs with a $GdO_X$ barrier was only achieved at liquid helium temperature or below, using thick FM electrodes with in-plane anisotropy. Notably, the lattice constant of cubic $Gd_2O_3$ has only a 5% mismatch with that of CoFe. Therefore, as in MTJs with both MgO (001) and Al2O3(001) barriers where a TMR above 200% has been achieved, a substantially large TMR may be obtained with an epitaxial $Gd_2O_3$ barrier, e.g., in CoFe(001)/$Gd_2O_3$(001) MTJs.

The saturation magnetization and anisotropy field of the Ta/CoFeB/GdO$_X$ structure have been determined to be 800 emu/cc and 6000 Oe, respectively. These values give rise to a PMA energy density of 2.6×106 erg/cc, which is comparable with CoFeB-MgO-pMTJs. Due to the interfacial nature of the PMA, the coercivity (H$_C$) of the CoFeB layers can be directly manipulated by voltage. As shown in FIG. 3B, a positive voltage reduces the H$_C$ of the top CoFeB layer and enhances the H$_C$ of the bottom CoFeB layer, as compared to those from the TMR curve measured under a negative voltage. (The top CoFeB has smaller switching fields, as will be discussed below.) This is the VCMA effect as previously observed in CoFeB/MgO-pMTJs, which may be attributed to the electric field induced redistribution of the electron densities among different d orbitals in FMs. These results establish CoFeB/GdO$_X$ as the only MTJ system other than CoFeB/MgO that exhibits RT TMR, PMA, and VCMA effects.

Figure 3C:
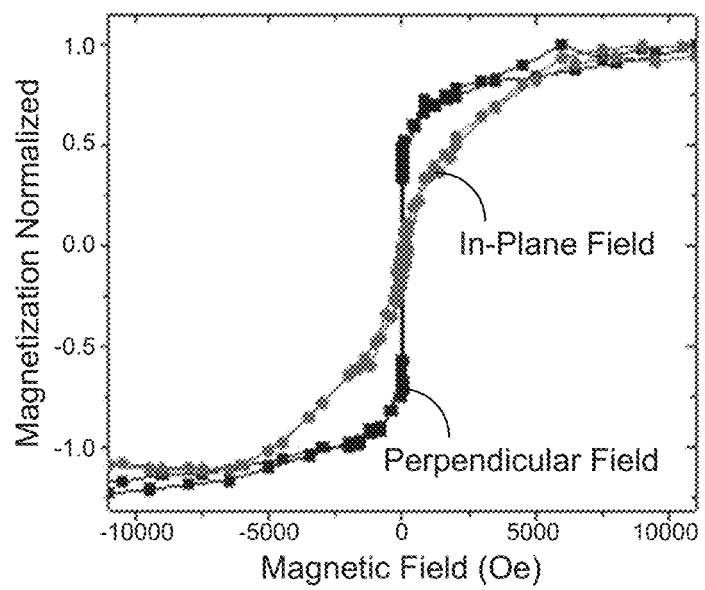

Magnetic properties of continuous films. FIG. 3C shows hysteresis loops of a continuous film (the bottom electrode of a pMTJ) measured by a vibrating sample magnetometer (Microsense, EZ9 series) with magnetic fields applied in the in-plane and out-of-plane directions. The structure of the film is Si-wafer/SiO$_2$/Ta (8 nm)/Ru (10 nm)/Ta (7 nm)/Co$_{20}$Fe$_{60}$B$_{20}$ (0.8 nm)/GdO$_X$ (2.5 nm)/Ta (7 nm)/Ru (20 nm). The saturation magnetization and perpendicular anisotropy field were determined to be 800 emu/cc and 6.5 kOe, respectively. These values give rise to a PMA energy density of 2.6×10$^6$ erg/cc, which is comparable with CoFeB-MgO pMTJs. The background signals from the substrate and sample holder have been subtracted.

Figure 3D:
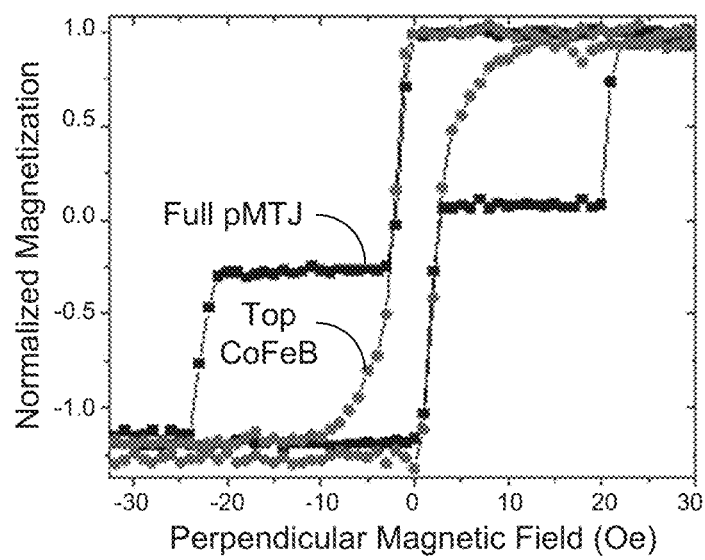

To distinguish between the hard and soft layers of the pMTJ, a pMTJ was fabricated without the bottom CoFeB layer and it was compared with a full pMTJ. FIG. 3D shows hysteresis loops for the two different samples (full pMTJ and top CoFeB layer only). The top CoFeB switches at smaller fields, demonstrating that the soft layer in the full pMTJ is the top CoFeB layer while the hard layer is the bottom CoFeB layer.

Owing to the large ionic mobility of oxygen vacancies in GdO$_X$, both the magnetic anisotropy field (HA) and saturation magnetization (MS) in Pt/Co/GdO$_X$ multilayers can be manipulated by controlling the oxidation state of the Co through external electric fields in a nonvolatile fashion. As a result, the Co can be reversibly changed from an optimally-oxidized state with a strong perpendicular magnetic anisotropy to a metallic state with an in-plane magnetic anisotropy or to a fully-oxidized state with nearly zero magnetization, depending on the polarity of the applied voltage. While the change of MS and HA can be probed by anomalous Hall effect or Kerr rotation measurements, it is generally understood to be much more challenging to realize such magneto-ionic control of magnetism in an MTJ structure because TMR has more stringent requirements on the interface quality and tunneling spin polarization. Here, such an effect is demonstrated in pMTJs. The apparent coercivities of the top and bottom CoFeB layers, measured in full TMR loops, are defined as H$_{C-TOP}$ and H$_{C-BOT}$. These coercivities are dependent on the interlayer coupling, as opposed to the intrinsic coercivities H$_{C'-TOP}$ and H$_{C'-BOT}$, which are not influenced by the interlayer coupling.

Figure 4A:
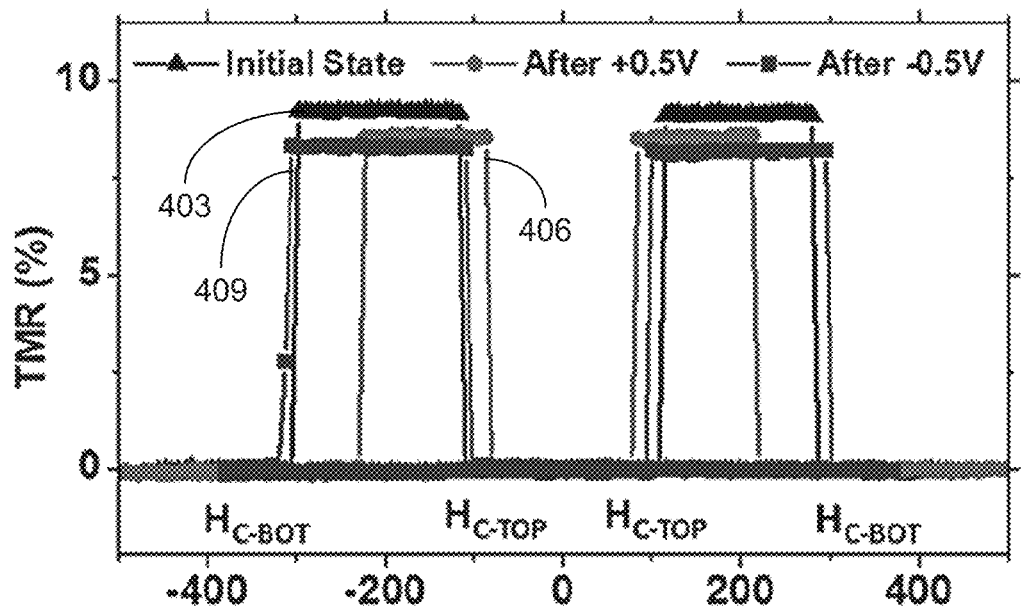
FIGS. 4A and 4B illustrate an example of voltage controlled interlayer coupling (VCIC) in a $GdO_x$-pMTJ, in accordance with various embodiments of the present disclosure.
Figure 4B:
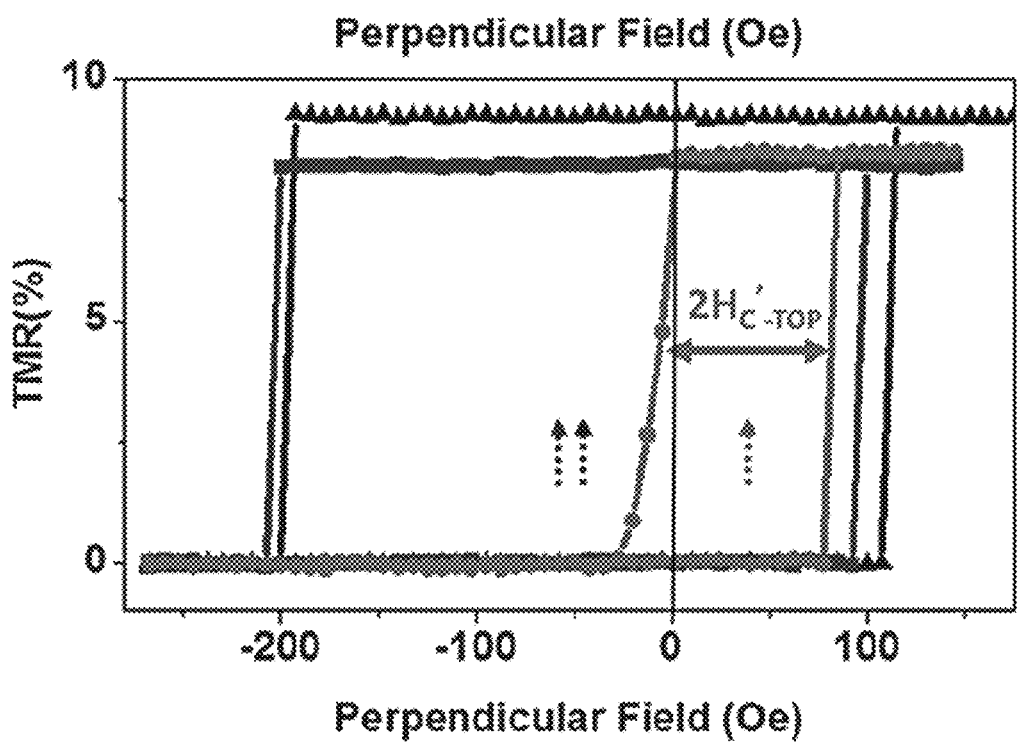

FIGS. 4A and 4B illustrate an example of voltage controlled interlayer coupling in a GdO$_X$-pMTJ. The initial full TMR curve 403 of a GdO$_X$-pMTJ is shown in FIG. 4A. After application of a +0.5V setting voltage (VSET) for 300 s at an elevated temperature of 150° C., the TMR 406 was measured when the junction was returned to RT. As a result of the magneto-ionic effect, both H$_{C-TOP}$ and H$_{C-BOT}$ are reduced and the MTJ showed a narrow antiparallel plateau. Subsequently, the H$_{C-TOP}$ and H$_{C-BOT}$ of the TMR 409 can be restored to almost their original values by applying VSET=−0.5V for 25 s at 150° C. Note that the TMR curves were measured at RT under a low bias voltage of less than 10 mV (5-10 mV) after the removal of VSET. The apparent coercivities of the top and bottom CoFeB layers are labeled as H$_{C-TOP}$ and H$_{C-BOT}$. Therefore, this effect is distinctly different from the VCMA effect shown in FIG. 3B, where the change of H$_C$ is only observed during the application of large voltages. Realization of this nonvolatile control of TMR immediately opens up new applications such as, e.g., microwave devices and magnetic field sensors with variable sensitivity and range.

Next, the minor TMR loops for the three states are shown in FIG. 4B. The interlayer coupling field (H$_{IC}$) is revealed by the center position of the loop (marked by arrows in FIG. 3b). The initial state of the interlayer coupling is negative (AFM), with H$_{IC}$=−42 Oe. After the application of +VSET, two striking features emerge. First, H$_{C'-TOP}$ is dramatically reduced (from 150 Oe to 45 Oe), much more pronounced than the reduction of He-TOP (from 100 Oe to 80 Oe). Second and most surprisingly, the sign of the interlayer coupling is changed; namely, the coupling is now positive (FM) with H$_{IC}$=+37 Oe. Remarkably, with the application of −VSET, the center of the minor loop can be shifted back to the left, with an even more negative H$_{IC}$ of −51 Oe. The results illustrated in FIG. 4B represent the first demonstration of VCIC in an MTJ system, where both the magnitude and sign of the interlayer coupling can be changed by applied voltage.

The dashed arrows indicate the position of H$_{IC}$ in the three states. The intrinsic coercivity of the top CoFeB is labeled as H$_{C'-TOP}$. The minor loops were measured by switching only the magnetization of the top CoFeB layer while keeping the magnetization of the bottom CoFeB pointing down. The fact that the H$_{C-TOP}$ is much larger than H$_{C'-TOP}$ in the FM coupling configuration and much smaller than H$_{C'-TOP}$ in the AFM coupling configuration is in full agreement with VCIC. Since H$_C$=H$_C$'+H$_{IC}$, H$_C$ is larger (or smaller) than H$_c$' when the sign of H$_{IC}$ is set by voltage to be positive (or negative). Therefore the change of H$_{C-TOP}$ in FIG. 4A is much smaller compared to the change of H$_{C'-TOP}$ in FIG. 4B. This observation of VCIC is related to the unique properties of the GdO$_X$ barrier.

For comparison, the experiment was performed with MgO-pMTJs under the same conditions. To confirm that the observed large effect is related to GdO$_X$, the behavior of a perpendicular MgO MTJ was investigated under the same testing conditions. The blanket films were fabricated in the same deposition system with structure of Si wafer/SiO$_2$/Ta (8 nm)/Ru (10 nm)/Ta (7 nm)/Co$_{20}$Fe$_{60}$B$_{20}$ (0.86 nm)/MgO (1 nm)/Co$_{20}$Fe$_{60}$B$_{20}$ (1.5 nm)/Ta (7 nm)/Ru (20 nm). The films were subsequently patterned into circular MTJs in the same fashion as GdO$_X$-MTJ. The MgO-MTJs were annealed at 300° C. for 10 minutes before the TMR test.

Figure 5A:
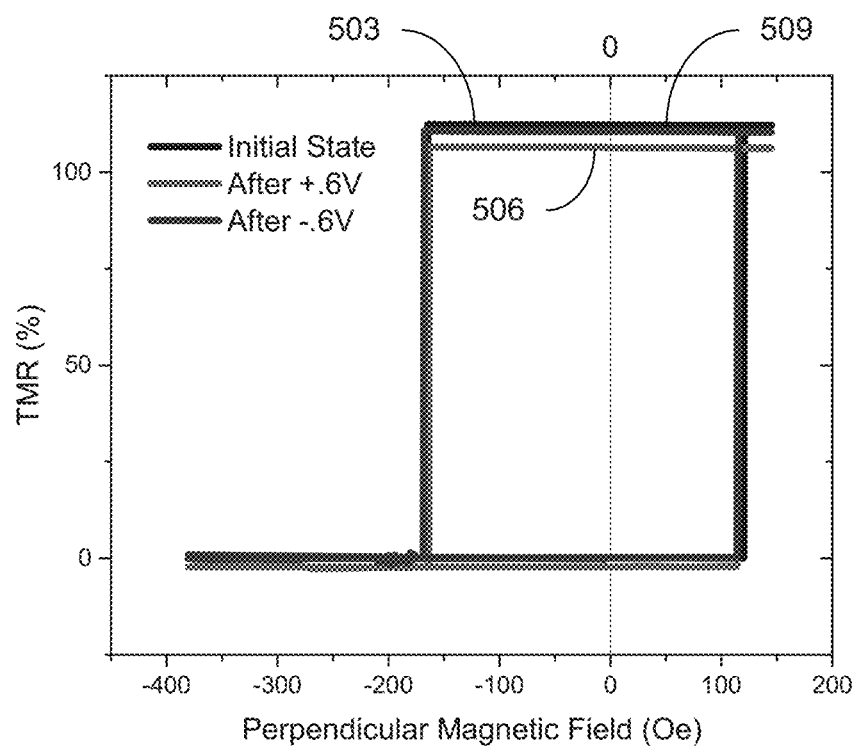
FIGS. 5A and 5B illustrate minor TMR curves of a (magnesium oxide) MgO-pMTJ and $GdO_x$-pMTJ, in accordance with various embodiments of the present disclosure.

Control experiment with MgO-pMTJ and annealing experiment without VSET. To confirm that the change in interlayer coupling was a unique property due to the GdO$_X$, a comparison experiment was run with the MgO-pMTJ, under the same testing conditions as the GdO$_X$-pMTJ described in FIGS. 4A and 4B. FIG. 5A shows the minor TMR curves of an MgO-pMTJ measured at RT in the initial (fresh) state (503) and after +V$_{set}$ (506) and −V$_{set}$ (509). No change was observed in the H$_{IC}$ of the MgO-pMTJ as can be seen.

Figure 5B:
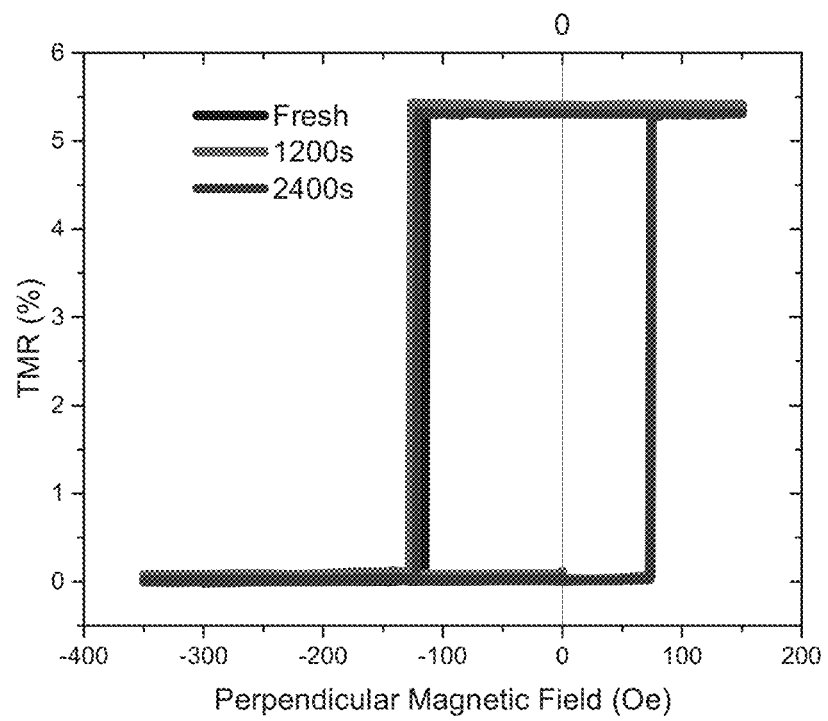

To further verify that the change in interlayer coupling in $GdO_X$-pMTJs was due to the applied voltage, instead of any annealing effects at 150-200° C., the $H_{IC}$ of a $GdO_X$-pMTJ was tested after annealing with no voltage applied. FIG. 5B shows the minor TMR curves of a $GdO_X$-pMTJ measured at RT in the fresh state and after 1200 s and 2400 s at 200° C. with no applied voltage. Even with heating for far longer than that used in the VCIC experiments, there was no change in $H_{IC}$, demonstrating that the change of $H_{IC}$ is indeed due to the voltage applied to the pMTJs.

Figure 6A:
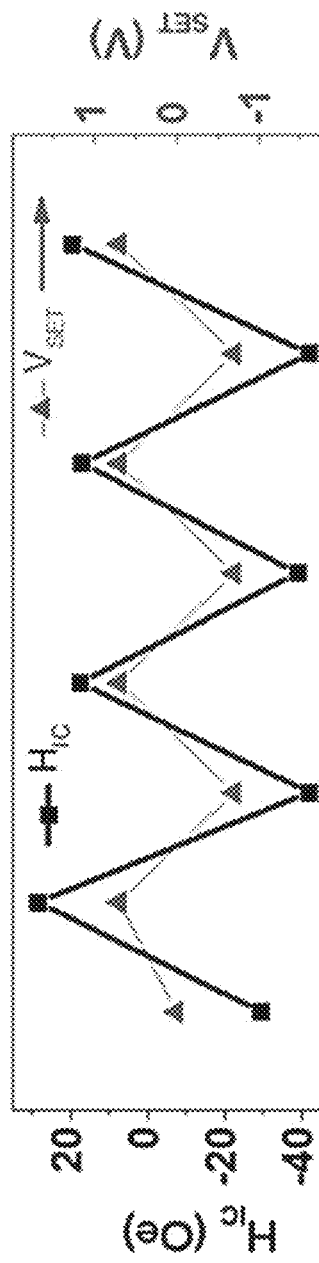
FIGS. 6A-6C illustrate examples of the reversible and deterministic control of interlayer coupling with voltage, in accordance with various embodiments of the present disclosure.
Figure 6B:
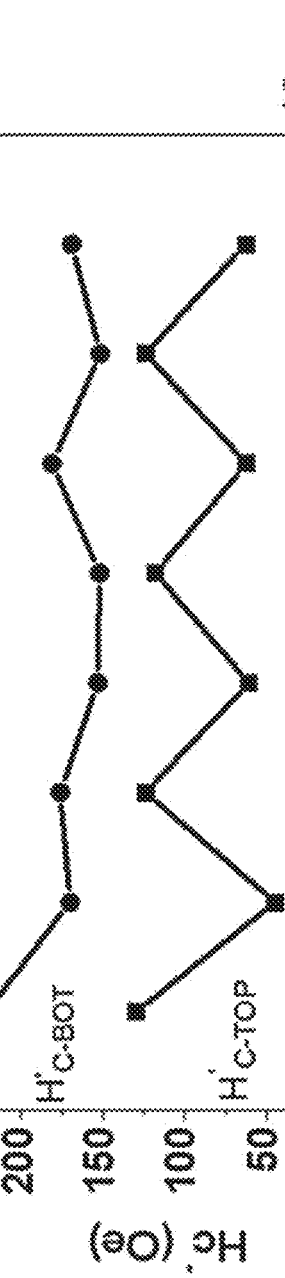
Figure 6C:
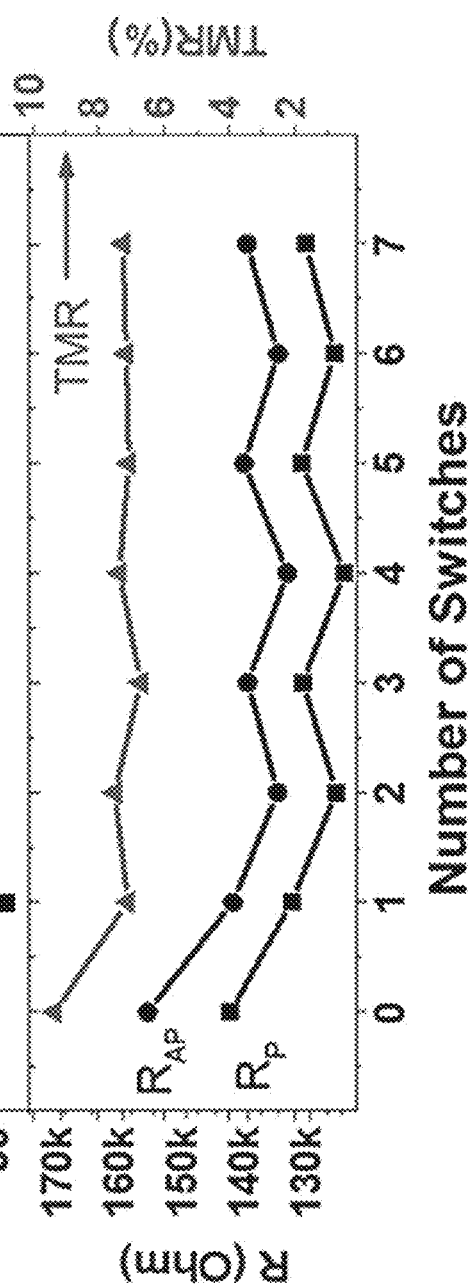

FIGS. 6A-6C illustrate examples of the reversible and deterministic control of the interlayer coupling by voltage. This control of interlayer coupling is fully reversible and deterministic as further demonstrated by the continuous switching of $H_{IC}$ by $V_{SET}$ in FIG. 6A. Namely, FM coupling can always be achieved by $+V_{SET}$ and AFM coupling by $-V_{SET}$. The corresponding intrinsic switching fields $H_{C'-TOP}$ and $H_{C'-BOT}$ are presented in FIG. 6B. Clearly, the value of $H_{C'-TOP}$ is always decreased (or increased) by applying a positive (or negative) voltage. This is consistent with the picture of voltage-driven oxidation where the top CoFeB is increasingly oxidized (or reduced) by oxygen vacancies due to the positive (or negative) electric field applied to the $GdO_X$ barrier. Ideally, $H_{C'-BOT}$ should behave opposite to $H_{C'-TOP}$, which indeed was the case after the fourth switching, although the change was smaller than that of Het-TOP.

The non-ideal behavior of $H_{C'-BOT}$ in the beginning and its smaller change in magnitude are likely related to the weaker effect that voltage has on the bottom CoFeB layer, due to its much stronger PMA as a result of the fabrication method. It can be understood that the AFM coupling state corresponds to a large antiparallel plateau (or a larger difference between $H_{C-TOP}$ and $H_{C-BOT}$) and that the FM coupling state corresponds to a smaller antiparallel plateau (or a smaller difference between $H_{C-TOP}$ and $H_{C-BOT}$) in the TMR curves, as shown in FIG. 4A, further validating the control of interlayer coupling by voltage.

Lastly, both RP and RAP can be systematically controlled by the applied voltages, while the TMR stayed nearly flat despite the change in sign of the interlayer coupling. Although in this proof-of-concept study, $V_{SET}$ was applied at 150° C.-180° C. for at least a few tens of seconds, the speed of this effect can, in principle, be dramatically improved upon optimization. For example, it has been demonstrated that large magneto-ionic effects in Pt/Co/$GdO_X$ can be realized in hundreds of µs at RT and that resistance changes due to voltage-driven $O_2-$ motion can be very fast (ns) in memristors.

Previous studies on interlayer coupling were focused on metallic spinvalves with interest later shifting to MTJs due to the larger ratio of TMR compared to that of GMR. The coupling was described by the quantum interferences of wave functions due to spin-dependent reflections at the FM/NM interfaces or by the torques exerted by spin-polarized conduction electrons. AFM coupling in MTJs in most cases is related to oxygen vacancies and is also fundamentally more interesting because FM coupling could simply result from pinholes in the tunnel barrier or orange peel effects. For example, in high quality epitaxial Fe/MgO/Fe MTJs, the observed negative $H_{IC}$ was explained by interlayer coupling mediated through oxygen vacancies in the MgO barrier. It was further demonstrated in a DFT calculation that not only the magnitude but also the sign of the interlayer coupling could be changed by controlling the distribution of oxygen vacancies in the MgO barrier. However, these studies were carried out on MTJ systems with in-plane magnetic anisotropy, which cannot be directly applied to the presented pMTJs, where both the HA and MS of the FMs can be directly modified through VCMA or magneto-ionic effects. A study on AFM coupling in pMTJs was carried out on Co/MgO/Co system9, where an oscillatory $H_{IC}$ was observed with varying Co thickness and explained by Fabry-Perot interferences within Bruno's theory. A model based on roughness induced orange peel coupling was successfully employed to explain the interlayer coupling in (Co/Pt)—Ru—(Co/Pt) spinvalves with PMA. According to this model, the AFM coupling is enhanced when the PMA of the FMs is increased.

Figures 7A, 7B:
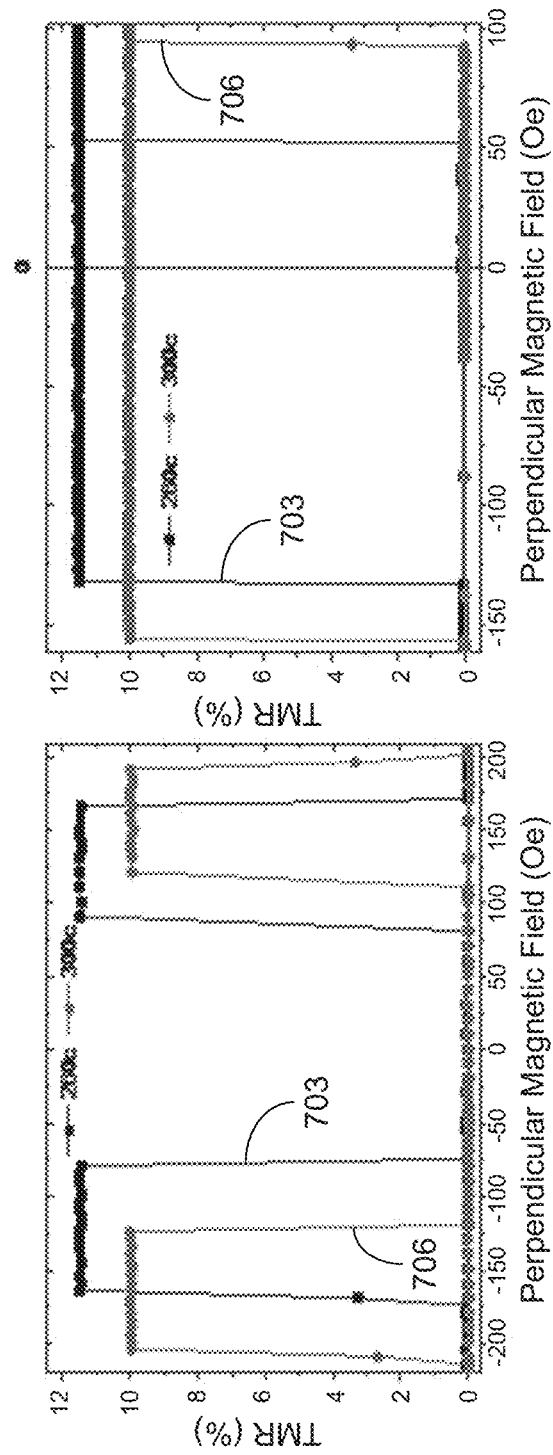
FIGS. 7A and 7B illustrate examples of full and minor TMR loops of a pMTJ, in accordance with various embodiments of the present disclosure.

Dependence of $H_{IC}$ with PMA of $GdO_X$-pMTJ. In the $GdO_X$-pMTJs, however, a decrease in AFM coupling was observed when the PMA of the CoFeB layers was increased. According to a model proposed by Moritz et al. in "Orange peel coupling in multilayers with perpendicular magnetic anisotropy: Application to (Co/Pt)-based exchange-biased spin-valves" (*Europhys. Lett.* 65, pp. 123-129, 2007), which is hereby incorporated by reference in its entirety, the interlayer coupling in (Co/Pt)—Ru—(Co/Pt) PMA spinvalves can be explained by an extended Neel-type orange peel coupling induced by correlated roughness. In this model, the AFM coupling is stronger in samples with larger PMA, which cannot explain the decrease of AFM coupling illustrated in FIGS. 7A and 7B. FIG. 7A shows the full TRM loops of a pMTJ after annealing at 260° C. for 60 s (703), then subsequently at 300° C. for 180 s (706), and FIG. 7B illustrates that corresponding minor loops showing decrease in $H_{IC}$ despite increasing PMA. As shown in FIG. 7A, the pMTJ was measured after annealing at 260° C. for 60 s, then subsequently after annealing at 300° C. for 180 s. The PMA of both of the magnetic layers was higher after the 300° C. annealing, as is evident from larger switching fields for both the hard and soft CoFeB layers as shown in FIG. 7A. This increase in PMA, however, corresponds to a decrease in AFM coupling as shown in FIG. 7B, with $H_{IC}$ dropping from −40 Oe to −31.5 Oe after 300° C. annealing. This suggests that the AFM coupling in the CoFeB/$GdO_X$/CoFeB system cannot be explained by the Moritz model. Therefore, the interlayer coupling in the pMTJs cannot be explained by the model based on roughness induced Neel-type coupling.

Figures 8A, 8B, 8C:
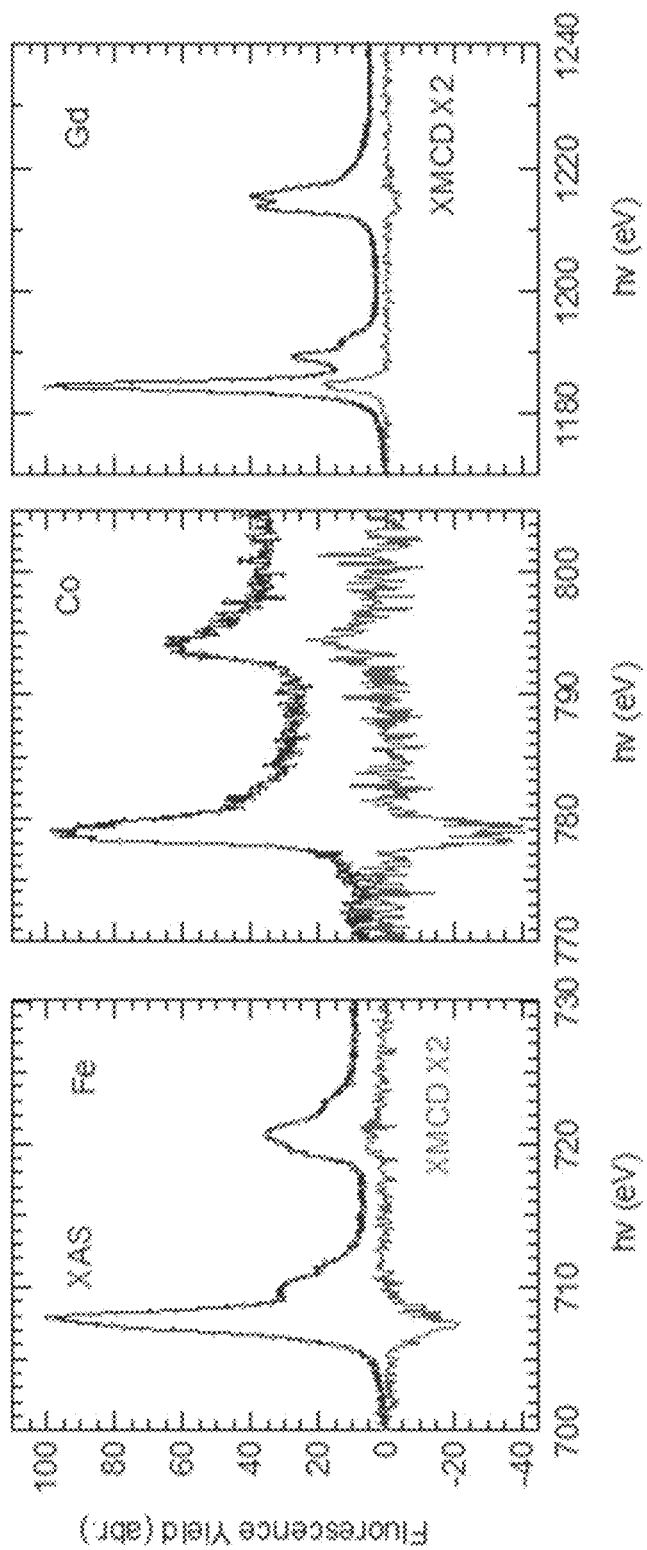
FIGS. 8A-8C illustrate examples of x-ray absorption (XAS) and magnetic circular dichroism (XMCD) spectra at the L edges of Fe and Co and the M edge of Gd in a pMTJ, in accordance with various embodiments of the present disclosure.

In situ TMR and X-ray absorption and X-ray magnetic circular dichroism. To shed more light on the observed VCIC, an in situ experiment was designed where the TMR, X-ray absorption spectroscopy (XAS), and X-ray magnetic circular dichroism (XMCD) were measured simultaneously at beam line 4-ID-C of the Advanced Photon Source. Soft x-ray absorption (XAS) and magnetic circular dichroism (XMCD) spectra were collected at beamline 4-ID-C of the Advanced Photon Source. A special pattern for the pMTJ was designed so both TMR and XMCD signals can be obtained simultaneously while sweeping the magnetic field. A large junction size of D=200 µm and a thicker $GdO_X$ barrier thickness (>3 nm) were used for this purpose. Examples of the RT data on an as-prepared junction are shown in FIGS. 8A-8C. Fluorescence yield XAS and XMCD spectra at the L edges of Fe and Co are shown in FIGS. 8A and 8B, and the M edge of Gd in the pMTJ before voltage was applied is shown in FIG. 8C.

Data were collected at the Fe and Co $L_{2,3}$ edges and the Gd $M_{4,5}$ edges, with an incident beam angle of 70° with respect to the film plane and with an applied magnetic field of 3.5 kOe normal to the film plane. The high incident angle was purposely used to improve the sensitivity to the buried magnetic layers of interest. The XMCD spectra are given by the difference of the x-ray absorption spectra of the right and left circularly polarized x-rays detected by fluorescence yield, and the XAS spectra are given by the average of the x-ray absorption spectra. The data were normalized by the x-ray intensity and then by the edge jump before and after the $L_3$ of the average absorption spectra. On the high energy side of the Fe $L_3$ main peak, a clear shoulder has been found, indicating the existence of a high oxidation state of Fe, either $Fe_3O_4$ or $\alpha\text{-}Fe_2O_3$. The spin and orbital components of the Co, Fe and Gd magnetization were estimated using the XMCD sum-rules. The explicit forms at $L_{2,3}$ edges of the 3d transition metals in unit of $\mu_B$/ion are:

$$m_{orb} = -\frac{4}{3} n_h \frac{\int_{L3+L2} (\mu_+ - \mu_-) dE}{\int_{L3+L2} (\mu_+ + \mu_-) dE} \quad (1)$$

$$m_{spin} = -n_h \left(1 + \frac{7\langle T_z \rangle}{2\langle S_z \rangle}\right)^{-1} \frac{\int_{L3}(\mu_+ - \mu_-)dE - 2\int_{L2}(\mu_+ - \mu_-)dE}{\int_{L3+L2}(\mu_+ + \mu_-)dE} \quad (2)$$

The explicit forms at $M_{4,5}$ edges for 4f rare earth metals are:

$$m_{orb} = -3n_h \frac{\int_{M5+M4} (\mu_+ - \mu_-) dE}{\int_{M5+M4} (\mu_+ + \mu_- + \mu_0) dE} \quad (3)$$

$$m_{spin} = -\frac{3}{2} n_h \left(1 + 3\frac{\langle T_z \rangle}{\langle S_z \rangle}\right)^{-1} \frac{2\int_{M5}(\mu_+ - \mu_-)dE - 3\int_{M4}(\mu_+ - \mu_-)dE}{\int_{M5+M4}(\mu_+ + \mu_- + \mu_0)dE}, \quad (4)$$

where $\mu+$ and $\mu-$ are the absorption intensity with left and right circularly polarized x-rays, respectively; $\mu_0$ was approximated by the average value of $\mu+$ and $\mu-$ during the calculation; $n_h$ is the number of holes in the 3d (4f) shells; and $<Tz>$ and $<Sz>$ are the expectation value of the spin operator and the magnetic dipole operator, respectively. The factor $$\frac{\langle T_z \rangle}{\langle S_z \rangle}$$

was assumed to be small and ignored. The photon incident angle (70°), and the circular polarization of 96% have been accounted for in the calculations.

During the calculations, the hole numbers $n_h^{3d}=2.5$ for Co, $n_h^{3d}=4.2$ for Fe (in FeOx), and $n_h^{4f}=7$ for Gd were used. Clearly the magnetic moment from Gd ions are antiparallel to that of Fe and Co, as shown in FIGS. 8A-8C. At RT, the spin (orbital) moment was calculated to be 0.51 (0.07) $\mu_B$ per Fe atom, 1.26 (0.09) $\mu_B$ per Co atom, and −0.46 (−0.20) $\mu_B$ per Gd atom, respectively. The accuracy of the sum rule becomes worse as the number of electrons decreases in the 3d orbital. It could significantly underestimate the Fe spin moment by ~30%; on the other hand, the accuracy of the spin moments of Co and Gd are about 10%. Due the much larger Fe concentration in the $Co_{20}Fe_{60}B_{20}$ electrodes, the magnetic field dependence of XMCD signal was only performed for Fe.

In order to further confirm that the large Gd magnetization is due to the proximity effect, the dichroic reflectivity was measured of two unpatterned reference samples: a CoFeB/$GdO_X$ bilayer and a $GdO_X$ single layer. The resonant magenetic scattering data have much better signal/noise ratio making it very sensitive to the weak magnetic signals from buried interfaces. Experiments were conducted with an incident angle of 10 deg. with ±5 kOe in-plane fields. FIGS. 8D and 8E illustrate examples of the measured dichroic reflectivity as a function of photon energy at the Gd $M_5$ edge on the CoFeB/$GdO_X$ bilayer and on the $GdO_X$ single layer samples, respectively. The data shown in FIGS. 8D and 8E were normalized by the direct beam intensity. There is a strong magnetic scattering near the Gd $M_5$ edge in the CoFeB/$GdO_X$ bilayer, but not in the single $GdO_X$ layer sample, indicating that the strong Gd magnetic signal is indeed due to the proximity effect.

The pMTJ studied has a parallel resistance of 8.7 kΩ and a TMR of 11% as plotted in FIG. 5a. Clear XAS and XMCD spectra for the Fe and Co $L_{2,3}$ edges were observed at photon energies of 700-730 eV and 770-810 eV, respectively. Surprisingly, a clear XMCD signal was observed at the Gd $M_5$ edge (1180-1190 eV) under zero magnetic field with an average magnetic moment of 0.6 μB per Gd, indicating the existence of ferromagnetic order in the $GdO_X$. Since $Gd_2O_3$ is a weak antiferromagnet with a Neel temperature of less than 5K, no ferromagnetism is expected in $GdO_X$ at RT. Indeed this net XMCD signal becomes vanishingly small in standalone $GdO_X$ barriers without CoFeB layers, as discussed above. In addition, the resistance of $GdO_X$-pMTJs exponentially increases with barrier thickness similar to what is seen in high quality MgO-pMTJs with TMR larger than 160%, and IV curve fittings of the MTJs give rise to an average barrier height of 1eV similar to $AlO_x$ based junctions.

Figure 9:
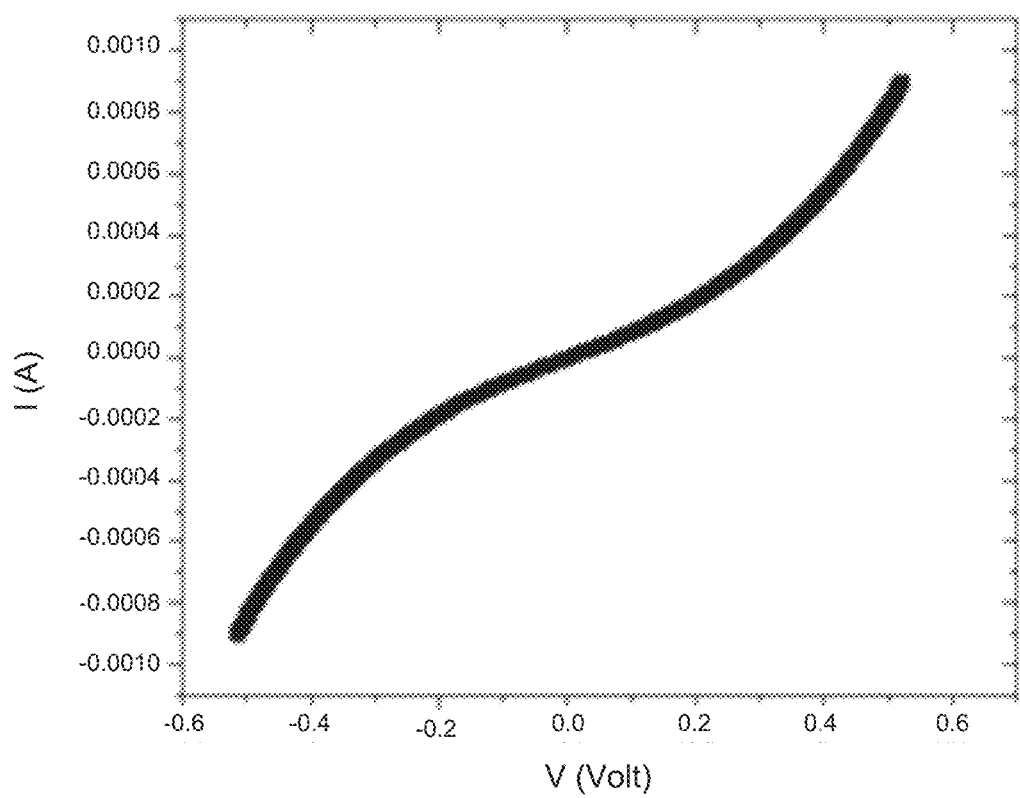
FIG. 9 is an example of a current-voltage (IV) curve from a $GdO_x$-pMTJ, in accordance with various embodiments of the present disclosure.

IV curves of $GdO_X$-pMTJs. If the observed Gd magnetic moment was in part due to unoxidized free Gd metal left in the tunnel barriers, then the IV characteristics of the $GdO_X$-pMTJs at high bias voltage is expected to be substantially different from that of normal tunnel junctions. In such a case, a very low barrier height is expected due to defect-assisted tunneling. IV curves of the $GdO_X$-pMTJs, however, behave similarly to what is observed in MTJs with amorphous $AlO_x$. One representative IV curve from a $GdO_X$-pMTJ is shown in FIG. 9. A fitting by Simmons' model yields a barrier height of about 1 eV, which is comparable with that observed in normal $AlO_x$-MTJs.

These facts further rule out any existence of free Gd in the tunnel barrier, although determining the exact oxidation state of the Gd ions in the barrier stays challenging due to its amorphous nature. More strikingly, the magnetic field dependence of the $GdO_X$ XMCD signal showed two distinct transitions, at fields corresponding to the $H_{C-TOP}$ and $H_{C-BOT}$ of the TMR curve, as shown in FIG. 10A. FIGS. 10A-10D show examples of simultaneous measurement of TMR and XMCD in a $GdO_X$-pMTJ, with FIG. 10A illustrating the magnetic field dependence of junction resistance and the XMCD signal measured at the Gd $M_5$-edge (1184.7 eV). This unexpected observation of ferromagnetic order in $GdO_X$ suggests that the magnetic signal is induced by the CoFeB layers through the proximity effect as observed in Pt/Fe47. The appearance of two distinct jumps in the XMCD hysteresis loop arising from the single $GdO_X$ barrier layer supports this notion, reflecting the short range nature of proximity coupling. Furthermore, the direction of the induced FM moment of $GdO_X$ is antiparallel to that of Fe and Co as discussed above. This antiferromagnetic locking of moments between Fe and Gd ions explains why the induced moments of $GdO_X$ switch at the exact same magnetic fields as CoFeB, as can be seen in FIG. 5a. This large induced magnetization of the $GdO_X$ barrier is probably related to the giant spin moment of $Gd^{3+}$ (S=7/2), which has exhibited exotic behaviors such as generating a Zeeman splitting field of 4T even when only 1.5T was applied to $Gd_2O_3/Al/Al_2O_3/Fe$ junctions.

To take a closer look at the VCIC effect, the pMTJ was set to AFM and FM coupled states as shown in the minor TMR loops in FIG. 10B, which illustrates the minor TMR loops of the pMTJ set in the AFM and FM coupling states. XMCD full hysteresis loops for Fe and Gd ions are displayed in FIGS. 10C and 10D, respectively. FIG. 10C illustrates the XMCD hysteresis loops measured at the Fe $L_3$-edge (707.2 eV) for the AFM and FM states in FIG. 10B, and FIG. 10D illustrates the XMCD hysteresis loops measured at the Gd $M_5$-edge (1184.7 eV) for the AFM and FM states in FIG. 10B. First, the Gd loops in the AFM and FM states generally resemble the shape of the Fe loops but with opposite sign, as anticipated from the antiferromagnetic coupling between the Gd ions and the CoFeB. Second, the hysteresis loops for both Fe and Gd in the AFM state exhibit a wider plateau between the two transitions, which corresponds to the high resistance state of the pMTJ, agreeing with what is presented in FIG. 4A. Third and most significantly, these measurements directly confirm the hypothesis on voltage driven oxidation/reduction in the $GdO_X$-pMTJs and the proximity-induced moment of the Gd ions by CoFeB. The transition at 150 Oe in the hysteresis loops of FIG. 10O corresponds to the top CoFeB layer. The relative magnitude of this transition is smaller (or larger) after the pMTJ is set to the FM (or AFM) state by applying a positive (or negative) voltage, exactly as anticipated since a positive (or negative) VSET drives $O^{2-}$ toward (or away from) the top CoFeB layer. Moreover, the magnitude of the two transitions of the Gd ions in FIG. 10D is proportional to that of the Fe in FIG. 10O, showing a one-to-one correspondence between the moment of $GdO_X$ and the moment of Fe, which further demonstrates that the observed XMCD signal from Gd ions is induced by the proximity effect from Fe.

To qualitatively explain the observed VCIC in a phenomenological model, consider the following. The large induced moment of 0.6 µB per Gd ion, nearly 20 times stronger than the induced moment of Pt in Pt/Fe bilayers, is very interesting. Usually magnetic ions in the barrier will cause spin-flip scattering and are therefore detrimental to TMR. Here, the moments of the Gd ions come from the deeply buried f orbitals that have little influence on conduction electrons. They may, however, play an important role in the magnetic properties, e.g., the coupling of the two CoFeB layers in a $GdO_X$-pMTJ. By considering the voltage-driven oxidation level changes of Fe, the large induced moment of the Gd ions that is proportional to the amount of free Fe, and a voltage dependent distribution of correlated moments in the Gd ions, the VCIC effect can be realized as shown in the model presented below. The HIC can be changed between ±100 Oe with appropriate approximations, which is comparable with what has been observed experimentally.

Origin of observed VCIC effect. Previous theories of voltage controlled interlayer coupling did not consider the direct manipulation of $H_A$ and $M_S$ or, more significantly, a large induced magnetic moment in the barrier. Therefore, these theories cannot be applied to the observed effects in the present $GdO_X$ pMTJs. The average ferromagnetic moment of Gd ions induced by CoFeB is 0.6 $\mu_B$ per $Gd^{3+}$ ion, which is nearly 20 times larger than the induced moment of Pt in Pt/Fe bilayers. Interface-induced magnetization in tunnel barriers has also been observed in other MTJ systems, where it affects the spin-dependent transport. However, the induced moment of $Gd^{3+}$ is not expected to significantly affect the transport properties of the junctions due to the localized nature of f electrons. It may, however, play an important role in the magnetic properties, e.g., the coupling of the two CoFeB layers in the pMTJ. Generally in the magnetic proximity effect, the depth distribution of the induced moments in the NM layers varies from system to system. For example, it is estimated that 90% of the induced moments in Pt on Co exist only in the first four monolayers from the interface, with a characteristic decay length of 0.41 nm. In other cases, however, the induced magnetization can extend much deeper into the NM layer, such as in $Bi_2Se_3/EuS$ where the first 2 nm of $Bi_2Se_3$ has been found to be ferromagnetic.

Figure 11A:
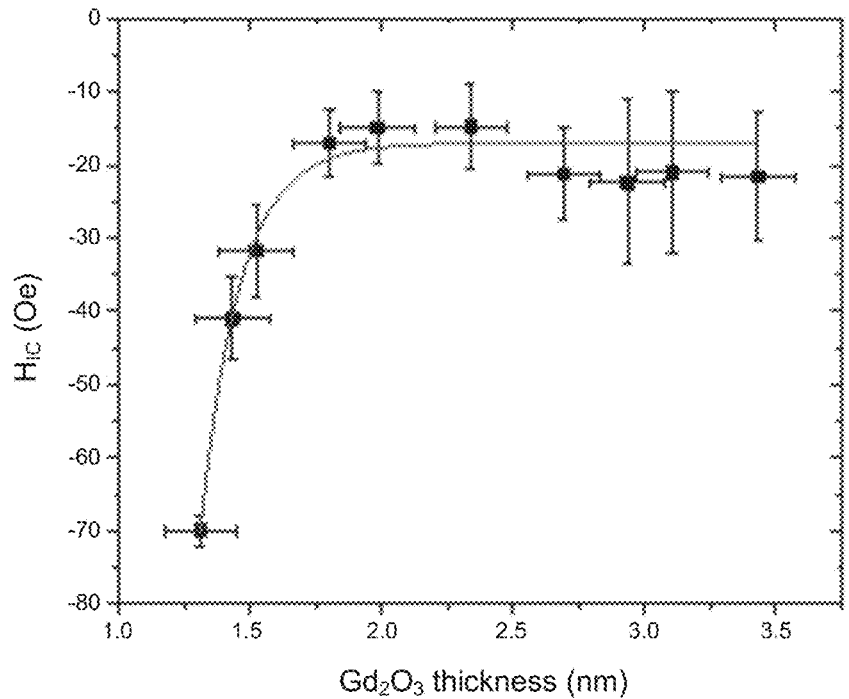
FIGS. 11A and 11B illustrate examples of thickness dependence of the interlayer coupling field ($H_{IC}$) of a $GdO_x$-pMTJ, in accordance with various embodiments of the present disclosure.

The thickness dependence of the $H_{IC}$ in the initial state of the $GdO_X$-pMTJ is plotted in FIG. 11A, which shows the $H_{IC}$ vs. the thickness of the tunnel barrier. The $H_{IC}$ was measured in pMTJs with the initial state (before the application of $V_{SET}$). The AFM coupling in the samples is extended to much thicker barriers compared to MBE grown Fe/MgO/Fe MTJs with in-plane magnetic anisotropy. The overall shape of the curve, however, resembles that of Fe/MgO/Fe MTJs with a sharp increase of $H_{IC}$ when the thickness of $GdO_X$ is reduced below 1.5 nm. This barrier thickness dependence of $H_{IC}$ is similar to that of sputtered CoFeB/MgO/CoFeB MTJs, where the AFM coupling persists to $d_{MgO}>2.2$ nm, and of $(Pt/Co)_3$—NiO—$(Pt/Co)_3$ multilayers, where coupling continues to $d_{NiO}>2$ nm. Due to the induced moment of Gd ions in the barrier, the nonmagnetic portion of the $GdO_X$ barrier (corresponding to the thickness of MgO in previous studies) is thinner than the total $GdO_X$ thickness, which may partly explain why the AFM coupling here is observed with a thicker barrier in the $GdO_X$-pMTJs. Under present conditions, $V_{SET}$ (0.5-0.8V) needs to be applied to the $GdO_X$-pMTJs for between a few tens of seconds and a few minutes, which could lead to the breakdown of the tunnel barrier when the $GdO_X$ is less than 2 nm thick. Due to this limitation, most VCIC experiments in this disclosure were performed on pMTJs with $GdO_X$ thicker than 2 nm. The speed of the effect and therefore the endurance of the barrier could possibly be enhanced dramatically, as this type of magneto-ionic effect in Pt/Co/$GdO_X$ can be realized in hundreds of µs. Therefore, the same VCIC in junctions can be achieved with thin barriers ($GdO_X<1.5$ nm) when the quality of the $GdO_X$ barrier is improved.

The VCIC with thick $GdO_X$ (>2 nm) can be described with a model considering the voltage-driven oxidation level changes of Fe, the large induced moment of the Gd ions that is proportional to the amount of free Fe, and a voltage dependent distribution of correlated moments in the Gd ions. Since oxygen in the $GdO_X$ barrier can be reversibly moved toward or away from the interface by applying voltage, the correlation of the magnetic moment distributions between the two interfaces created by the oxygen transportation may be responsible for the observed VCIC. The XMCD has shown that the Gd ions display significant magnetic moments due to the proximity effect with CoFeB. These large induced Gd moments may contribute to the interplay coupling via dipolar interaction, especially in samples with thick barriers (>2 nm).

Consider two thin magnetic layers separated by a distance d. The coupling energy between these two layers can be expressed as:

$$E = \frac{\mu_0}{4\pi} \int d\rho_1 d\rho_2 \frac{m_1(\rho_1) \cdot m_2(\rho_2) - 3[m_1(\rho_1) \cdot \hat{r}_{12}][m_2(\rho_2) \cdot \hat{r}_{12}]}{r_{12}^3} \quad (5)$$

where $m_1(m_2)$ is the magnetic moment at the position $\rho_1(\rho_2)$, $r_{12}=\rho_1-\rho_2+d\hat{z}$, $r_{12}=|r_{12}|$, and $\hat{r}_{12}=r_{12}/r_{12}$. For perpendicularly magnetized layers, the above integration is identically zero if the magnetic moments in each layer are uniformly distributed. In the present case, the migration of the oxygen vacancies to the two interfaces may create a highly non-uniform distribution of the interface moments. Consider an impurity moment $\delta m_i(\rho_i)=m_i(\rho_i)-\overline{m}_i$, where $\overline{m}_i$ is the optimally and uniformly magnetized magnetic moment of the i-th layer. One may think of $m_i$ as a Gd ion that is polarized by a Fe atom next to it. Consequently $m_i$ is zero if the neighboring Fe atom is oxidized by $O^{2-}$ driven by the applied voltage. To estimate the magnitude of the coupling from such non-uniform distributions, define the correlation function between the distributions of the magnetic moments of the two layers, $$\xi_{12}(\rho_1-\rho_2)=<\delta m_1(\rho_1)\cdot\delta m_2(\rho_2)>-<\delta m_1(\rho_1)><\delta m_2(\rho_2)> \quad (6)$$

where $<>$ refers to the spatial average over the plane of the layers (for a fixed $\rho_1-\rho_2$). Due to the much stronger PMA of the bottom CoFeB layer (FIG. S3), the change in magnetic properties of top CoFeB layer by voltage to be much larger than that of bottom CoFeB, which is supported by FIG. 6B. Assuming that the applied voltage from the positive to negative polarity results in a change of the correlation function from the correlated ($\xi_{12}>0$) to the anti-correlated ($\xi_{12}<0$) state, i.e., the oxidation level (therefore the induced moment from Gd ions) of the two interfaces is likely similar if $|\rho_1-\rho_2|<r_0$ for a positive voltage, where $r_0$ is the correlation length. For a negative voltage, the oxidation level of the two interfaces is likely to be less similar, giving rise to $\xi_{12}<0$. With the above assumptions, the coupling field $H_{IC}=-\delta E/\delta\delta m_1$ can be estimated. The z-component of the coupling field is thus, $$H_{IC}^z = \frac{\mu_0}{4\pi}\frac{\mu_B}{a^2}\int d^2\rho \frac{2z^2-\rho^2}{(\rho^2+z^2)^{\frac{5}{2}}}\xi_{12}(\rho). \quad (7)$$

Figure 11B:
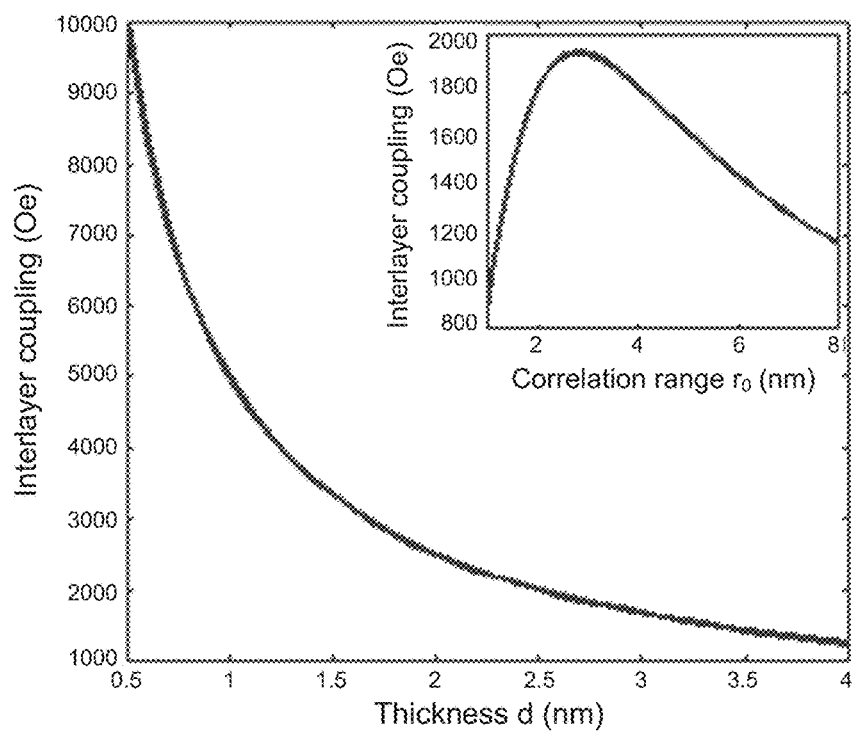

If a simple correlation function $\xi_{12}(\rho)=n^2S^2\theta(r_0-\rho)$ is taken, where n is the density of impurities, S is the spin, and $\theta$ is the step function, one can analytically integrate the above Equation. In the inset of FIG. 11B, the coupling field as a function of the correlation range $r_0$ in nm is shown. Taking the maximum value for the optimal $r_0$ for each thickness of the barrier, the plot of FIG. 11B illustrates the coupling field as a function of the barrier thickness (the variation of HIC with the distance between two layers) with n=1 and S=3.

The $GdO_X$ barrier in the pMTJ used in the XMCD experiment has a thickness of 3.4 nm, with an average induced moment of 0.6 $\mu_B$ per Gd ion as shown in FIG. 5A. If most of these moments reside in only the first monolayers of $GdO_X$ (0.27 nm) next to CoFeB on both sides of the barrier, the induced moment per Gd ion can be as large as ~3.7 $\mu_B$, which is the basis for using S=3 in Equation (7). Alternatively, if it is assumed that the induced moment of the Gd ions resides in the first two monolayers (0.54 nm) next to CoFeB on both sides of the barrier, there is an average induced moment of ~1.8 $\mu_B$ per Gd ion, which can be described approximately by S=2. For n=1, S=3, and d=2 nm, $H_{IC}$ can be found to be about 2500 Oe as shown in FIG. 11B. With a more realistic approximation of n=0.2 that corresponds to a 20% impurity density, $H_{IC}\approx100$ Oe with the sign determined by $\xi_{12}$, which is comparable the experimental results.

The temperature dependence of $GdO_X$-based pMTJs has also been investigated from room temperature (RT) down to 11K. The spin-independent tunneling contributes only a small portion to the total conductance, similar to $AlO_x$ and MgO based junctions, indicating a high-quality tunneling barrier. Most interestingly, $H_{IC}$ shows a nonmonotonic dependence on temperature, even changing sign below 80K. This behavior cannot be explained by any of the existing models, suggesting that the interlayer coupling in $GdO_X$-pMTJs is strongly linked to the magnetic properties of the $GdO_X$ barrier.

The samples were fabricated as previously described by magnetron sputtering in a 12 source UHV system with a base pressure of $10^{-9}$ Torr. The sample structure is $Si/SiO_2$/Ta (8 nm)/Ru (10 nm)/Ta (7 nm)/$Co_{20}Fe_{60}B_{20}$ (0.7-0.9 nm)/$GdO_X$ (1-3.5 nm)/$Co_{20}Fe_{60}B_{20}$ (1.5-1.6 nm)/Ta (7 nm)/Ru (20 nm). After deposition, the samples were patterned, using standard photolithography and ion etch procedures, into circular shapes with diameters (D) between 3 and 20 μm with a four wire contact geometry. The samples were measured on a custom probe station for RT measurements prior to wire bonding for temperature dependent measurements in an ARS sample in vapor cryostat with an external electromagnet. Although thick gadolinium oxide samples exhibit a cubic $Gd_2O_3$ crystallization, the thin oxide layers in the fabricated MTJ samples are amorphous and the oxidation state is difficult to determine, so the barrier is referred to here as $GdO_X$.

Figure 12:
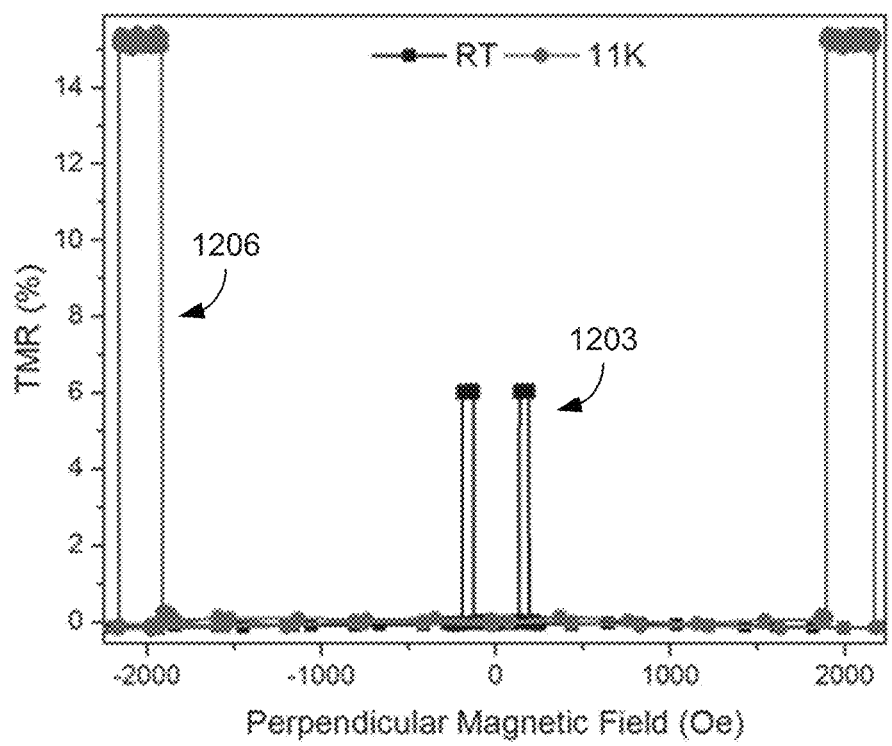
FIG. 12 illustrates examples of TMR curves from a pMTJs at RT and at 11 K, in accordance with various embodiments of the present disclosure.

Ferromagnetic layers in contact with gadolinium oxide have been shown to exhibit many unique voltage controlled magnetic properties. Due to the large ionic mobility of oxygen in $GdO_X$, it has been shown that voltage applied across a $GdO_X$/FM interface can modify the speed of domain wall motion, the magnetic saturation ($M_s$) and anisotropy field (HK), even to the degree of changing the direction of magnetic anisotropy between in-plane and perpendicular. Here, room temperature TMR up to 15% was obtained in pMTJs with the use of improved fabrication techniques and CoFeB FM electrodes. Referring to FIG. 12, examples of TMR curves from these pMTJs at both RT (1203) and 11 K (1206) are displayed, with TMR being defined as $(R_{AP}-R_P)/R_P$ where $R_{AP}$ and $R_P$ are the resistance in the antiparallel and parallel states, respectively. Both TMR curves show sharp resistance switchings and flat antiparallel plateaus as expected with pMTJs. Both the TMR and switching fields ($H_C$) increase considerably with the decrease in temperature as anticipated by previous results. Additionally, both temperatures show a TMR curve symmetric about zero field as expected. Although $Gd_2O_3$ shows antiferromagnetic ordering, its Neel temperature is below 4 K, lower than any of the testing conditions. FIGS. 12-14C correspond to a representative sample with a core structure of $Co_{20}Fe_{60}B_{20}$ (0.85 nm)/$GdO_X$ (2.5 nm)/$Co_{20}Fe_{60}B_{20}$ (1.5 nm), but all samples show similar trends.

The increase in TMR at low temperature is illustrative of a tunneling mechanism with a spin-dependent contribution and a spin-independent contribution in the style of the two current model described by Shang et al. in "Temperature dependence of magnetoresistance and surface magnetization in ferromagnetic tunnel junctions" (*Phys. Rev. B* 58, R2917-R2920, 1998), which is hereby incorporated by reference in its entirety. Following their model, $$G(\theta)=G_T(1+P_1P_2\cos\theta)+G_{SI}, \quad (8)$$

where the first term is spin-dependent tunneling and the second term, $G_{SI}$, is spin-independent conductance. The temperature dependence of $G_T$, the direct elastic tunneling prefactor, is given by $G_T = G_0 CT/\sin(CT)$, with $G_0$ a constant and $C = 1.378 \times 10^{-4}$ d/$\sqrt{\varphi}$, d being the barrier width in Å and $\varphi$ the barrier height in eV. Rewriting Equation (8) with symmetric FM electrodes, the standard TMR formula of Julliere can be rewritten as $TMR = 2P^2/(1-P^2 + G_{SI}/G_T)$, where P is the polarization of the CoFeB electrodes. The polarization is assumed to vary with temperature in the same way as the magnetization such that $P = P_0(1-\alpha T^{3/2})$.

Figure 13A:
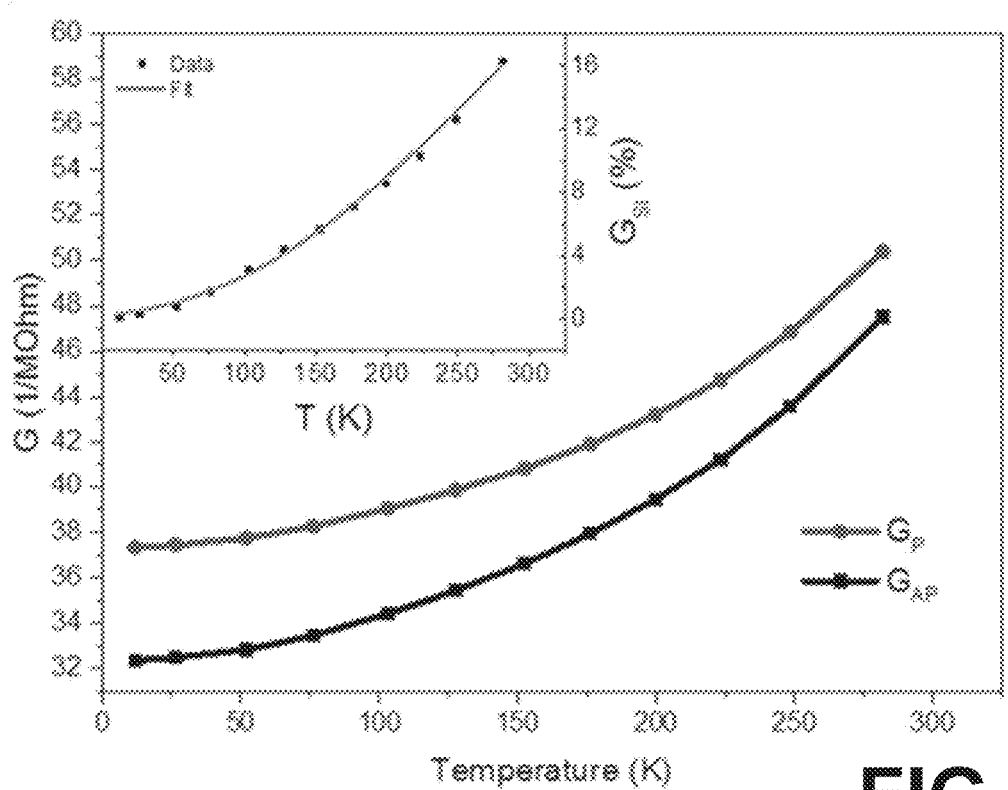
FIGS. 13A and 13B illustrate examples of conductance and TMR behavior of a $GdO_x$-pMTJ with respect to temperature, in accordance with various embodiments of the present disclosure.

FIG. 13A shows that the conductivity of both the parallel (1303) and antiparallel (1306) states decreases with temperature. This is indicative of an insulating barrier without pinholes. The inset of FIG. 13A shows $G_{SI}$ normalized to $G_P$, data (points) and fit (solid line). Looking at the conductance difference, $\Delta G = G_P - G_{AP}$, with $G_P$ being the conductance in the parallel state and $G_{AP}$ being the conductance in the antiparallel state, it is possible to investigate only the spin-dependent conductance, since plugging $\theta = 0$ and $\pi$ into Equation (8) and subtracting gives:

$$\Delta G = 2G_T P^2 = 2\ G_0 P_0^2 (1-\alpha T^{3/2})^2 CT/\sin(CT) \quad (9)$$

Fitting $\Delta G$ data to Equation (9) gives $P_0$ and a equal to 0.521 and $6.30 \times 10^{-5}$ $K^{3/2}$, respectively. This value of a is in the range expected based on previous MTJs with MgO and $Al_2O_3$ barriers.

Figure 13B:
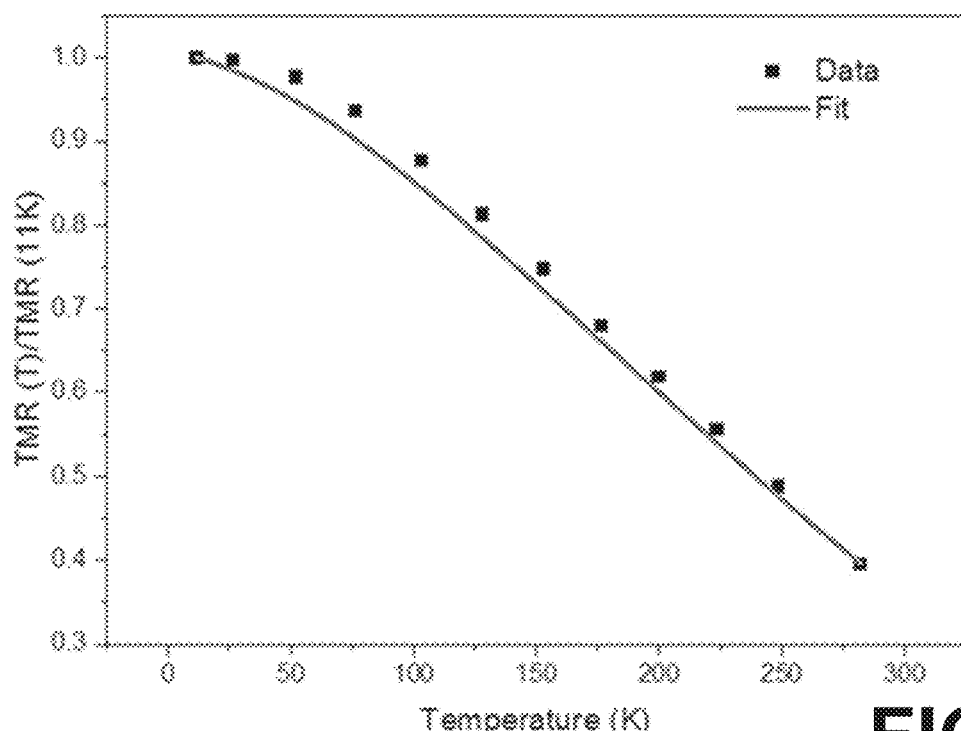

The inset of FIG. 13A shows the temperature dependence of $G_{SI}$. Assuming $G_{SI}$ is from conduction through localized defect hopping, which is mediated by coupling to phonons and so is strongly temperature dependent, its temperature dependence can be modeled. Under this assumption, $G_{SI}$ takes the form $$G_{SI} = \rho_N \sigma_N T^{(N-[2/(N+1)])}, \quad (10)$$

where N is the number of defect states involved in the hopping. The solid line in the inset of FIG. 13A shows that $G_{SI}$ is well fit by $\sigma_1 + \sigma_2 T^{1.33} + \sigma_3 T^{2.5}$ with $\sigma_1 = 6.2e-8$ $\Omega^{-1}$, $\sigma_2 = 1.1e^{-9}$ $\Omega^{-1}$ $K^{-1.33}$ and $\sigma_3 = 4.5e^{-12}$ $\Omega^{-1}$ $K^{-2.5}$. From this, it can be seen that the defect hopping at RT is strongly dominated by three state hopping. The quality of the barrier can be estimated by comparing the proportion of the total conductance contributed by $G_{SI}$ at RT. The $GdO_X$-pMTJs investigated here have a $G_{SI}$ contribution of about 14% of the total conductance at RT. In MTJs where a large number of defect states were present in the barrier, much larger $G_{SI}$ was reported. Here the $G_{SI}$ of $GdO_X$ is similar to 14-20% obtained with AlOx and MgO, indicating $GdO_X$ can serve as a high-quality tunneling barrier with low defect states. Therefore, a much higher TMR could possibly be achieved with a crystalline $Gd_2O_3$ barrier, as demonstrated in the case of MgO and $Al_2O_3$. With the temperature dependence of $G_T$ and $G_{SI}$, the TMR data can be compared to that of the model. FIG. 13B shows the TMR normalized to the TMR at 11K data (points) and fit (solid line). As illustrated, the data is well described by the TMR equation shown above and that the model is sufficient to describe the tunneling in the $GdO_X$ MTJs.

In addition to the full TMR loops, minor TMR loops were measured at each temperature by switching the free FM layer while the fixed FM layer remained pointing down for the entire loop. From the minor loop, the $H_{IC}$ can be measured from the shift of the loop along the magnetic field axis. If the minor loop is centered about a positive (or negative) field, the system is said to be ferromagnetically (or antiferromagnetically) coupled and prefers to be in a parallel (or antiparallel) state without an applied magnetic field.

Figure 14A:
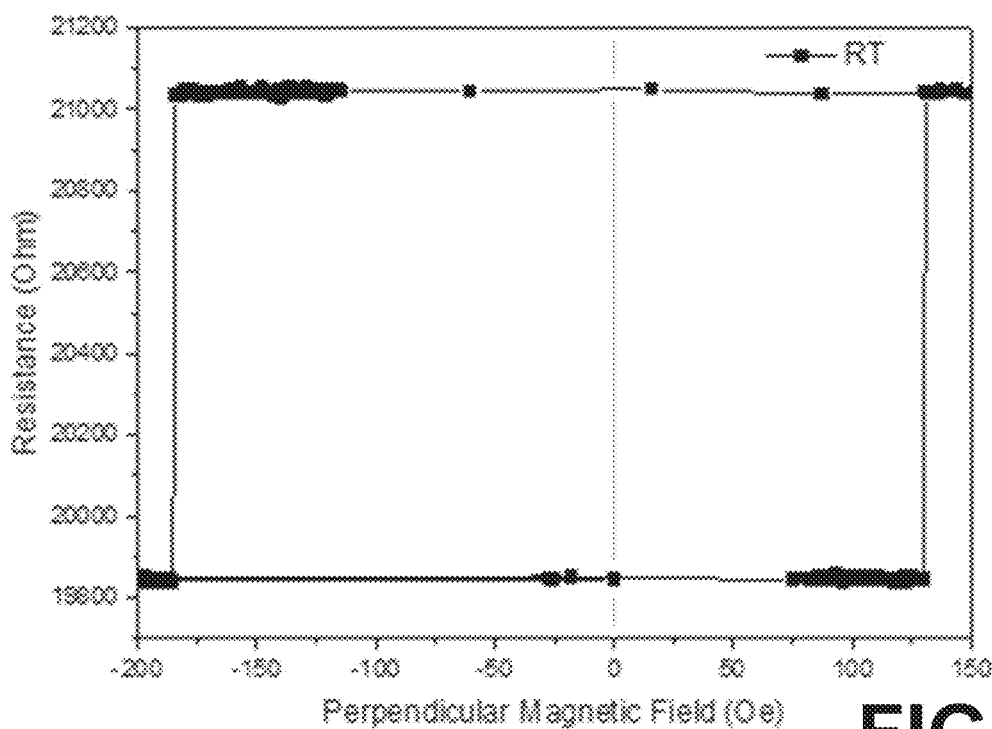
FIGS. 14A-14C illustrate examples of minor TMR loops at RT and 11 K and $H_{IC}$ temperature dependence of the $GdO_x$-pMTJ, in accordance with various embodiments of the present disclosure.
Figure 14B:
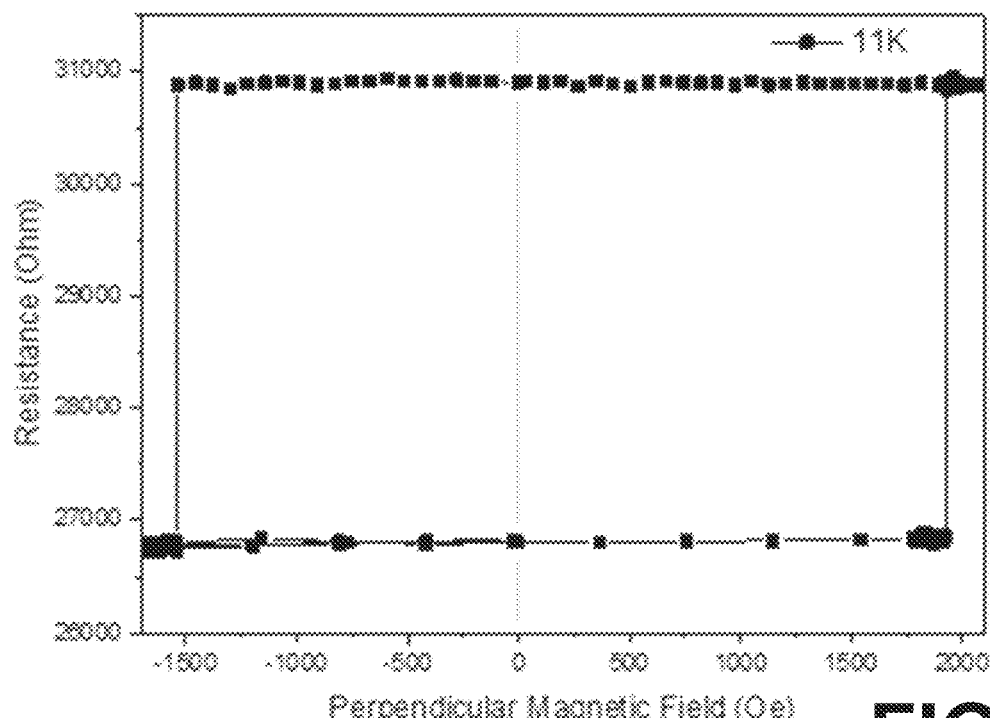
Figure 14C:
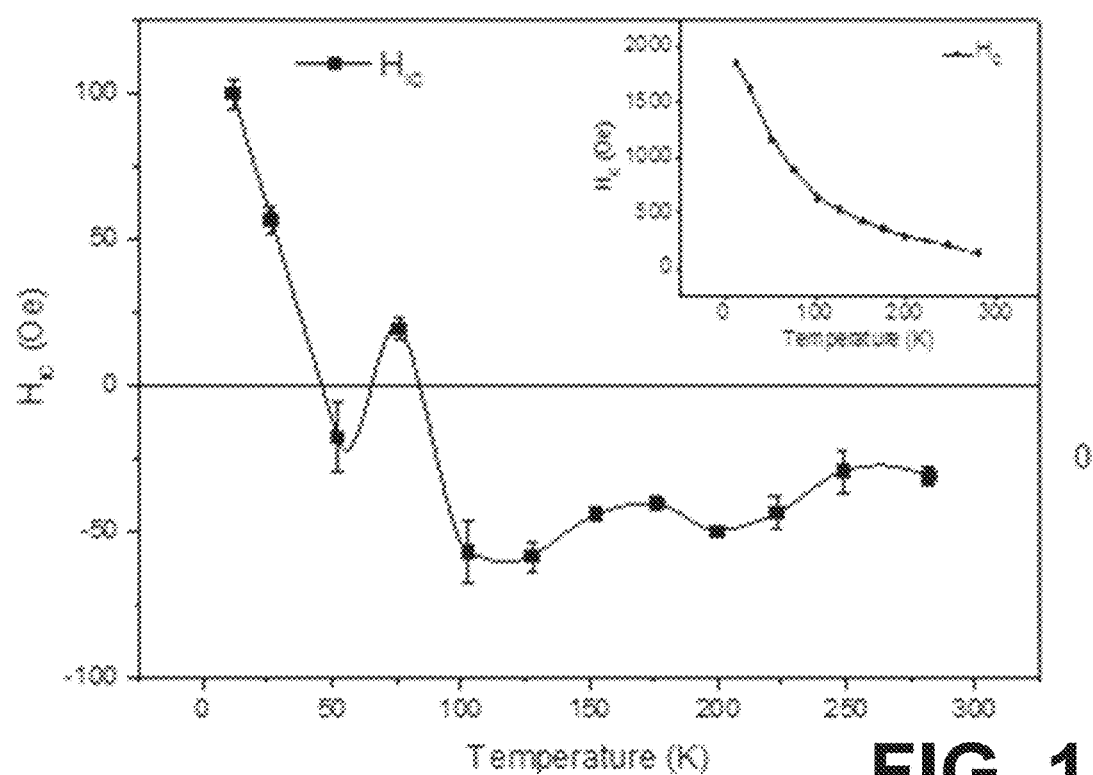

FIGS. 14A and 14B show the minor TMR loops of the same $GdO_X$ pMTJ at RT and 11 K, respectively. At RT, the pMTJ showed a $H_C$ of 157 Oe and a $H_{IC}$ of -31 Oe, consistent with the previous report. Notably, when cooled to 11 K, the $H_{IC}$ of the pMTJ changed sign to be +99 Oe, accompanied by an increase of $H_C$ to 1730 Oe. FIG. 14C illustrates $H_{IC}$ vs. T for the same temperature range showing a non-trivial temperature dependence. The error bars come from averaging repeated loop measurements at each temperature. The inset of FIG. 14C shows the positive switching field vs. temperature (T) from RT down to 11 K showing a smooth increase. The lines are a guide for the eye.

The wide range of systems in which interlayer coupling (IC) has been observed has led to several theories describing its origin in MTJs. The IC has been described in all metallic spinvalves based on spin-dependent reflections at the boundaries of the FM layers, which was extended to insulating MTJs with the inclusion of an imaginary Fermi momentum in the barrier. According to the theory, the IC across an insulating barrier should increase in magnitude with temperature following a $CT/\sin(CT)$ dependence and never change sign. This temperature dependence has been seen experimentally in junctions based on amorphous Si and $SiO_2$ barriers but does not explain the sign change seen between FIGS. 14A and 14B.

In MgO based MTJs with large TMR (in-plane magnetic anisotropy), another coupling mechanism has been shown where the IC is mediated through oxygen vacancies in the MgO barrier. The oxygen vacancies can act as impurity states in the barrier which mediate coupling through F center resonance. This coupling has been shown to be AFM if the energy level of the impurity state lies at the Fermi energy. This model predicts a smooth strengthening of the IC with decreasing temperature, which is opposite to the previous model. In a subsequent study, a sign change of $H_{IC}$ was predicted when the distribution of oxygen vacancies within the barrier was modified.

The interlayer coupling in pMTJs has been investigated less compared with in-plane MTJs, in part due to the larger difficulty involved with growing MTJs with out-of-plane easy axes. In one model, correlated roughness at the FM interfaces induces orange-peel type Neel coupling. Coupling of this type is strongly dependent on the magnetic anisotropy energy. For PMA electrodes, a low anisotropy leads to FM coupling, while a larger PMA gives rise to AFM coupling. Additionally, in the AFM coupling regime, stronger PMA leads to a stronger coupling strength. In this disclosure, a smaller $H_{IC}$ was observed when the PMA of the MTJ was increased by annealing at a higher temperature, which is an indication that the AFM coupling observed in $GdO_X$-pMTJs is not described by the model. However, the reduction of AFM coupling after annealing at a higher temperature could be a result of reduced roughness. The measurement of $H_{IC}$ from a single sample at different temperatures provides critical information for understanding IC in $GdO_X$-pMTJs. According to the model, with a fixed roughness the AFM coupling should get stronger at 11 K, due to a larger PMA, which is not consistent with FIGS. 14A and 14B. An AFM study of a truncated MTJ structure of $Si/SiO_2/Ta/Ru/Ta/Co_{20}Fe_{60}B_{20}/GdO_X$ showed that the $GdO_X$ layer is fairly smooth with an RMS roughness, $R_q = 0.675$ nm.

FIG. 14C illustrates the detailed temperature dependence of $H_{IC}$ from RT down to 11 K. It shows a nontrivial dependence that is not reflected by any of the models of IC described previously and does not match previous experimental data from other MTJ systems. Similarly, it does not follow the smooth temperature dependence of the switching field as shown in the inset of FIG. 14C, further confirming that it is not following the trend of the sample's PMA. In addition to the large magnitude and sign change shown between RT and 11 K in FIGS. 14A and 14B, there is a complex temperature dependence at intermediate temperatures, including multiple switches between AFM and FM coupling states, as shown in FIG. 14C.

This unprecedented behavior of IC in $GdO_X$ pMTJs may be attributed to the large proximity effect induced magnetic moment of the Gd ions in the barrier. The induced magnetic moment of the Gd is found to be antiferromagnetically coupled to the FM electrodes and exhibits two distinct switchings, corresponding to the MTJ switching fields, suggesting that it is coupled to both electrodes separately. If the IC in the $GdO_X$ pMTJs is mediated through the proximity magnetism of the Gd barrier, it could have a much more complex dependence on temperature than that predicted by earlier models. Previous studies have shown that the $H_{IC}$ becomes negligibly small for thick enough barriers, generally vanishing for barriers thicker than 1 to 2 nm. The magnetic moment of the Gd may also explain why the IC in the $GdO_X$ pMTJs extends to much thicker barriers than previously demonstrated. The effective barrier thickness may be significantly smaller than the thickness of the $GdO_X$ if the proximity effect magnetizes a significant portion of each side of the barrier.

In summary, VCIC in a new pMTJ system with a $GdO_X$ barrier has been demonstrated. Through the unique combination of strong interfacial PMA, efficient manipulation of oxygen vacancies, and a large induced net moment of $GdO_X$, not only the magnitude but also the sign of the interlayer coupling can be effectively manipulated by applied voltage. These results can be applied to a new class of spintronic devices where magnetization switching can be accomplished by voltage controlled interlayer coupling. A simple model based on the voltage driven correlation of the magnetic moments of two magnetic layers has been shown to roughly account for the sign change and the magnitude of $H_{IC}$. The temperature dependence of $GdO_X$ based pMTJs has also been investigated from RT down to 11 K. The spin-independent conductance contributes a small proportion of the total conduction, indicative of a high-quality barrier. The most interesting result is that of the $H_{IC}$, which shows a nonmonotonic dependence on temperature, including changing sign below 80 K. This behavior suggests that the interlayer coupling in $GdO_X$-pMTJs is mediated through the unique magnetic properties of the $GdO_X$ tunneling barrier.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A magnetic tunnel junction (MTJ) device, comprising:
a first ferromagnetic (FM) layer, where the first FM layer is a fixed FM layer consisting of a single layer of FM material having a first thickness;
a gadolinium oxide ($GdO_X$) tunnel barrier having a first side disposed on a first side of the first ferromagnetic layer, where the $GdO_X$ tunnel barrier comprises $Gd_2O_3$, and a resistance state of the MTJ device is controllable at room temperature;
a first buffering layer disposed on a second side of the first FM layer opposite the $GdO_X$ tunnel barrier;
a second FM layer, where the second FM layer is a free FM layer consisting of a single layer of FM material having a second thickness greater than the first thickness, the second FM layer having a first side disposed on a second side of the $GdO_X$ tunnel barrier, where the FM material of the second layer has the same material composition as the FM material of the first layer; and
a second buffering layer disposed on a second side of the second FM layer opposite the $GdO_X$ tunnel barrier.

2. The MTJ device of claim 1, wherein the $GdO_X$ tunnel barrier between the first and second FM layers forms a perpendicular MTJ (pMTJ).

3. The MTJ device of claim 1, wherein application of a positive voltage pulse across the free and fixed layers under zero magnetic field sets the MTJ device to a non-volatile low resistance state.

4. The MTJ device of claim 1, wherein application of a negative voltage pulse across the free and fixed layers under zero magnetic field sets the MTJ device to a non-volatile high resistance state.

5. The MJT device of claim 4, wherein the negative voltage pulse establishes antiferromagnetic (AFM) coupling between the free and fixed layers.

6. The MTJ device of claim 1, wherein a thickness of the $GdO_X$ tunnel barrier is in a range from about 1 nm to about 3.5 nm.

7. The MTJ device of claim 1, wherein the first and second FM layers comprise cobalt iron boron (CoFeB).

8. The MTJ device of claim 1, wherein the thickness of the first FM layer is in a range from about 0.7 nm to about 0.9 nm and the thickness of the second FM layer is in a range from about 1.5 nm to about 1.6 nm.

9. A sensor comprising the MTJ device of claim 1, where the sensor detects a magnetic field.

10. A memory storage system comprising the MTJ device of claim 1.

11. The MTJ device of claim 1, wherein a thickness of the $GdO_X$ tunnel barrier is greater than 2 nm.

* * * * *